United States Patent
Cannan et al.

(10) Patent No.: US 8,931,553 B2
(45) Date of Patent: Jan. 13, 2015

(54) ELECTRICALLY CONDUCTIVE PROPPANT AND METHODS FOR DETECTING, LOCATING AND CHARACTERIZING THE ELECTRICALLY CONDUCTIVE PROPPANT

(71) Applicants: Carbo Ceramics Inc., Houston, TX (US); Sandia Corporation, Albuquerque, NM (US)

(72) Inventors: Chad Cannan, Cypress, TX (US); Lewis Bartel, Albuquerque, NM (US); Terrence Palisch, Richardson, TX (US); David Aldridge, Albuquerque, NM (US)

(73) Assignees: CARBO Ceramics Inc., Houston, TX (US); Sandia Coporation, Albuquerque, NM (US)

( * ) Notice: Subject to any disclaimer, the term of this patent is extended or adjusted under 35 U.S.C. 154(b) by 0 days.

(21) Appl. No.: 14/147,372

(22) Filed: Jan. 3, 2014

(65) Prior Publication Data
US 2014/0190686 A1 Jul. 10, 2014

Related U.S. Application Data

(60) Provisional application No. 61/749,093, filed on Jan. 4, 2013.

(51) Int. Cl.
*E21B 47/00* (2012.01)
*E21B 43/25* (2006.01)

(52) U.S. Cl.
CPC ............... *E21B 43/25* (2013.01); *E21B 47/00* (2013.01)
USPC ................. 166/250.01; 166/66; 166/254.1; 324/324

(58) Field of Classification Search
USPC ............. 166/308.1, 250.1, 254.1, 248, 280.1, 166/66, 254.2; 367/28, 128; 324/324, 325, 324/334, 338, 331, 333, 642, 643
See application file for complete search history.

(56) References Cited

U.S. PATENT DOCUMENTS

| | | |
|---|---|---|
| 3,103,975 A | 9/1963 | Hanson |
| 3,492,147 A | 1/1970 | Young et al. |

(Continued)

FOREIGN PATENT DOCUMENTS

| | | |
|---|---|---|
| EP | 0434439 | 12/1990 |
| GB | 1401303 | 7/1975 |

(Continued)

OTHER PUBLICATIONS

International Search Report and Written Opinion for PCT/US2014/010228 prepared by the ISA/US on May 5, 2014 (9 pages).

(Continued)

*Primary Examiner* — Kenneth L Thompson
*Assistant Examiner* — Ronald Runyan
(74) *Attorney, Agent, or Firm* — Haynes & Boone, LLP

(57) ABSTRACT

Electrically conductive proppants and methods for detecting, locating, and characterizing same are provided. The electrically conductive proppant can include a substantially uniform coating of an electrically conductive material having a thickness of at least 500 nm. The method can include injecting a hydraulic fluid into a wellbore extending into a subterranean formation at a rate and pressure sufficient to open a fracture therein, injecting into the fracture a fluid containing the electrically conductive proppant, electrically energizing the earth at or near the fracture, and measuring three dimensional (x, y, and z) components of electric and magnetic field responses at a surface of the earth or in an adjacent wellbore.

20 Claims, 10 Drawing Sheets

(56) References Cited

U.S. PATENT DOCUMENTS

| | | | |
|---|---|---|---|
| 3,533,829 A | 10/1970 | Quanquin | |
| 3,659,259 A | 4/1972 | Chaney, Jr. et al. | |
| 3,772,589 A | 11/1973 | Scholberg | |
| 3,929,191 A | 12/1975 | Graham et al. | |
| 4,030,549 A | 6/1977 | Bouck | |
| 4,068,718 A | 1/1978 | Cooke, Jr. et al. | |
| 4,181,014 A | 1/1980 | Zuvela et al. | |
| 4,401,162 A | 8/1983 | Osborne | |
| 4,427,068 A | 1/1984 | Fitzgibbon | |
| 4,440,866 A | 4/1984 | Lunghofer et al. | |
| 4,491,796 A | 1/1985 | Smith | |
| 4,550,779 A | 11/1985 | Zakiewicz | |
| 4,567,945 A | 2/1986 | Segalman | |
| 4,585,064 A | 4/1986 | Graham et al. | |
| 4,613,161 A | 9/1986 | Brisco | |
| 4,705,108 A | 11/1987 | Little et al. | |
| 4,724,434 A | 2/1988 | Hanson et al. | |
| 4,802,359 A | 2/1989 | Patrice | |
| 4,806,928 A | 2/1989 | Veneruso | |
| 4,839,644 A | 6/1989 | Safinya et al. | |
| 4,851,781 A | 7/1989 | Marzetta et al. | |
| 4,879,181 A | 11/1989 | Fitzgibbon | |
| 4,901,069 A | 2/1990 | Veneruso | |
| 4,942,926 A | 7/1990 | Lessi | |
| 4,986,530 A | 1/1991 | Steinhilber | |
| 5,008,661 A | 4/1991 | Raj | |
| 5,038,107 A | 8/1991 | Gianzero et al. | |
| 5,151,658 A | 9/1992 | Muramatsu et al. | |
| 5,188,175 A | 2/1993 | Sweet | |
| 5,200,705 A | 4/1993 | Clark et al. | |
| 5,353,873 A | 10/1994 | Cooke, Jr. | |
| 5,509,474 A | 4/1996 | Cooke, Jr. | |
| 5,542,472 A | 8/1996 | Pringle et al. | |
| 5,543,715 A | 8/1996 | Singer et al. | |
| 5,547,029 A | 8/1996 | Rubbo et al. | |
| 5,563,514 A | 10/1996 | Moulin | |
| 5,576,703 A | 11/1996 | MacLeod et al. | |
| 5,597,042 A | 1/1997 | Tubel et al. | |
| 5,662,165 A | 9/1997 | Tubel et al. | |
| 5,692,565 A | 12/1997 | MacDougall et al. | |
| 5,945,923 A | 8/1999 | Soulier | |
| 5,959,547 A | 9/1999 | Tubel et al. | |
| 6,006,831 A | 12/1999 | Schlemmer et al. | |
| 6,023,168 A | 2/2000 | Minerbo | |
| 6,025,721 A | 2/2000 | Vail, III | |
| 6,061,000 A | 5/2000 | Edwards | |
| 6,070,662 A | 6/2000 | Ciglenec et al. | |
| 6,116,342 A | 9/2000 | Clark et al. | |
| 6,131,658 A | 10/2000 | Minear | |
| 6,148,911 A | 11/2000 | Gipson et al. | |
| 6,216,783 B1 | 4/2001 | Hocking et al. | |
| 6,234,257 B1 | 5/2001 | Ciglenec et al. | |
| 6,302,203 B1 | 10/2001 | Rayssiguier et al. | |
| 6,330,914 B1 | 12/2001 | Hocking et al. | |
| 6,378,610 B2 | 4/2002 | Rayssiguier et al. | |
| 6,408,943 B1 | 6/2002 | Schultz et al. | |
| 6,411,084 B1 | 6/2002 | Yoo | |
| 6,426,917 B1 | 7/2002 | Tabanou et al. | |
| 6,443,227 B1 | 9/2002 | Hocking et al. | |
| 6,443,228 B1 | 9/2002 | Aronstam et al. | |
| 6,474,415 B1 | 11/2002 | Ohmer | |
| 6,538,576 B1 | 3/2003 | Schultz et al. | |
| 6,597,178 B1 | 7/2003 | Nichols et al. | |
| 6,626,238 B2 | 9/2003 | Hooper | |
| 6,633,164 B2 | 10/2003 | Vinegar et al. | |
| 6,684,952 B2 | 2/2004 | Brockman et al. | |
| 6,691,779 B1 | 2/2004 | Sezginer et al. | |
| 6,691,780 B2 | 2/2004 | Nguyen et al. | |
| 6,693,553 B1 | 2/2004 | Ciglenec et al. | |
| 6,719,055 B2 | 4/2004 | Mese et al. | |
| 6,725,926 B2 | 4/2004 | Nguyen et al. | |
| 6,766,854 B2 | 7/2004 | Ciglenec et al. | |
| 6,815,946 B2 | 11/2004 | Yoo | |
| 6,856,255 B2 | 2/2005 | Chalitsios et al. | |
| 6,864,801 B2 | 3/2005 | Tabanou et al. | |
| 6,876,959 B1 | 4/2005 | Peirce et al. | |
| 6,910,534 B2 | 6/2005 | Linyaev et al. | |
| 6,943,697 B2 | 9/2005 | Ciglenec et al. | |
| 6,959,773 B2 | 11/2005 | Mese et al. | |
| 6,987,463 B2 | 1/2006 | Beique et al. | |
| 7,000,697 B2 | 2/2006 | Goode et al. | |
| 7,009,707 B2 | 3/2006 | Beresford et al. | |
| 7,036,591 B2 | 5/2006 | Cannan et al. | |
| 7,082,993 B2 * | 8/2006 | Ayoub et al. | 166/250.1 |
| 7,095,223 B2 | 8/2006 | Yoo | |
| 7,140,434 B2 | 11/2006 | Chouzenoux et al. | |
| 7,151,377 B2 | 12/2006 | Chouzenoux et al. | |
| 7,168,487 B2 | 1/2007 | Salamitou et al. | |
| 7,173,542 B2 | 2/2007 | Beique et al. | |
| 7,187,961 B2 | 3/2007 | Yamashita et al. | |
| 7,210,526 B2 | 5/2007 | Knobloch | |
| 7,219,730 B2 | 5/2007 | Tilton et al. | |
| 7,319,330 B2 | 1/2008 | Amundsen | |
| 7,325,605 B2 | 2/2008 | Fripp et al. | |
| 7,331,385 B2 | 2/2008 | Symington et al. | |
| 7,398,680 B2 | 7/2008 | Glasbergen et al. | |
| 7,424,911 B2 | 9/2008 | McCarthy et al. | |
| 7,450,053 B2 | 11/2008 | Funk et al. | |
| 7,451,812 B2 | 11/2008 | Cooper et al. | |
| 7,453,768 B2 | 11/2008 | Hall et al. | |
| 7,502,690 B2 | 3/2009 | Thomsen et al. | |
| 7,568,532 B2 | 8/2009 | Kuckes et al. | |
| 7,597,146 B2 | 10/2009 | Winslow et al. | |
| 7,598,898 B1 | 10/2009 | Funk et al. | |
| 7,602,688 B2 | 10/2009 | Lee | |
| 7,631,691 B2 | 12/2009 | Symington et al. | |
| 7,637,318 B2 | 12/2009 | Sierra et al. | |
| 7,644,762 B2 | 1/2010 | Knobloch | |
| 7,703,515 B2 | 4/2010 | Chouzenoux et al. | |
| 7,712,527 B2 | 5/2010 | Roddy | |
| 7,726,397 B2 | 6/2010 | McDaniel et al. | |
| 7,728,900 B2 | 6/2010 | Fukushima et al. | |
| 7,779,683 B2 | 8/2010 | Glasbergen et al. | |
| 7,798,214 B2 | 9/2010 | Schmitt et al. | |
| 7,836,952 B2 | 11/2010 | Fripp | |
| 7,893,801 B2 | 2/2011 | Knobloch | |
| 7,921,910 B2 | 4/2011 | Wilson et al. | |
| 8,168,570 B2 | 5/2012 | Barron et al. | |
| 2001/0033164 A1 | 10/2001 | Vinegar et al. | |
| 2002/0000317 A1 | 1/2002 | Rayssiguier et al. | |
| 2002/0145423 A1 | 10/2002 | Yoo | |
| 2002/0174728 A1 | 11/2002 | Beresford et al. | |
| 2002/0179301 A1 | 12/2002 | Schultz et al. | |
| 2003/0094282 A1 | 5/2003 | Goode et al. | |
| 2003/0106684 A1 | 6/2003 | Hooper | |
| 2003/0205376 A1 | 11/2003 | Ayoub et al. | |
| 2004/0239316 A1 | 12/2004 | Yoo | |
| 2005/0017723 A1 | 1/2005 | Entov et al. | |
| 2005/0274510 A1 * | 12/2005 | Nguyen et al. | 166/250.12 |
| 2007/0278008 A1 | 12/2007 | Kuckes et al. | |
| 2008/0230219 A1 | 9/2008 | Kaminsky | |
| 2008/0264162 A1 | 10/2008 | Glasbergen et al. | |
| 2008/0271885 A1 | 11/2008 | Kaminsky | |
| 2008/0316049 A1 | 12/2008 | Verret et al. | |
| 2009/0056938 A1 | 3/2009 | Treviranus et al. | |
| 2009/0166030 A1 | 7/2009 | Zhuravlev et al. | |
| 2009/0179649 A1 | 7/2009 | Schmidt et al. | |
| 2009/0211754 A1 | 8/2009 | Verret et al. | |
| 2009/0250216 A1 | 10/2009 | Bicerano | |
| 2009/0288820 A1 * | 11/2009 | Barron et al. | 166/249 |
| 2010/0044034 A1 | 2/2010 | Bailey et al. | |
| 2010/0051266 A1 | 3/2010 | Roddy et al. | |
| 2010/0066560 A1 | 3/2010 | McDaniel et al. | |
| 2010/0078169 A1 | 4/2010 | Symington et al. | |
| 2010/0101793 A1 | 4/2010 | Symington et al. | |
| 2010/0102986 A1 | 4/2010 | Benischek et al. | |
| 2010/0147512 A1 | 6/2010 | Cramer et al. | |
| 2010/0223988 A1 | 9/2010 | Crow et al. | |
| 2010/0234249 A1 | 9/2010 | McDaniel et al. | |
| 2010/0282460 A1 | 11/2010 | Stone et al. | |

(56) References Cited

U.S. PATENT DOCUMENTS

| | | |
|---|---|---|
| 2010/0314108 A1 | 12/2010 | Crews et al. |
| 2011/0056687 A1 | 3/2011 | Fripp |
| 2011/0120710 A1 | 5/2011 | Dong et al. |

FOREIGN PATENT DOCUMENTS

| | | |
|---|---|---|
| GB | 2466861 | 7/2010 |
| GB | 2466862 | 7/2010 |
| WO | 2010057677 A1 | 5/2010 |
| WO | 2010079320 | 7/2010 |

OTHER PUBLICATIONS

Bartel, L.C., McCann, R.P., and Keck, L.J., Use of potential gradients in massive hydraulic fracture mapping and characterization, 51st Annual Fall Technical Conference and Exhibition of Society of Petroleum Engineers, New Orleans, Oct. 3-6, 1976 SPE 6090.

Bartel, L.C., Application of EM Holographic Methods to Borehole Vertical Electric Source Data to Map a Fuel Oil Spill, Sandia National Laboratories, 1993.

Lee, K.H., et al., A new approach to modeling the electromagnetic response to conductive media, Geophysics, vol. 54, No. 9 (1989).

Lee, K.H., et al., Tomographic Imaging of Electrical Conductivity Using Low-Frequency Electromagnetic Fields, Lawrence Berkeley Lab, 1992.

* cited by examiner

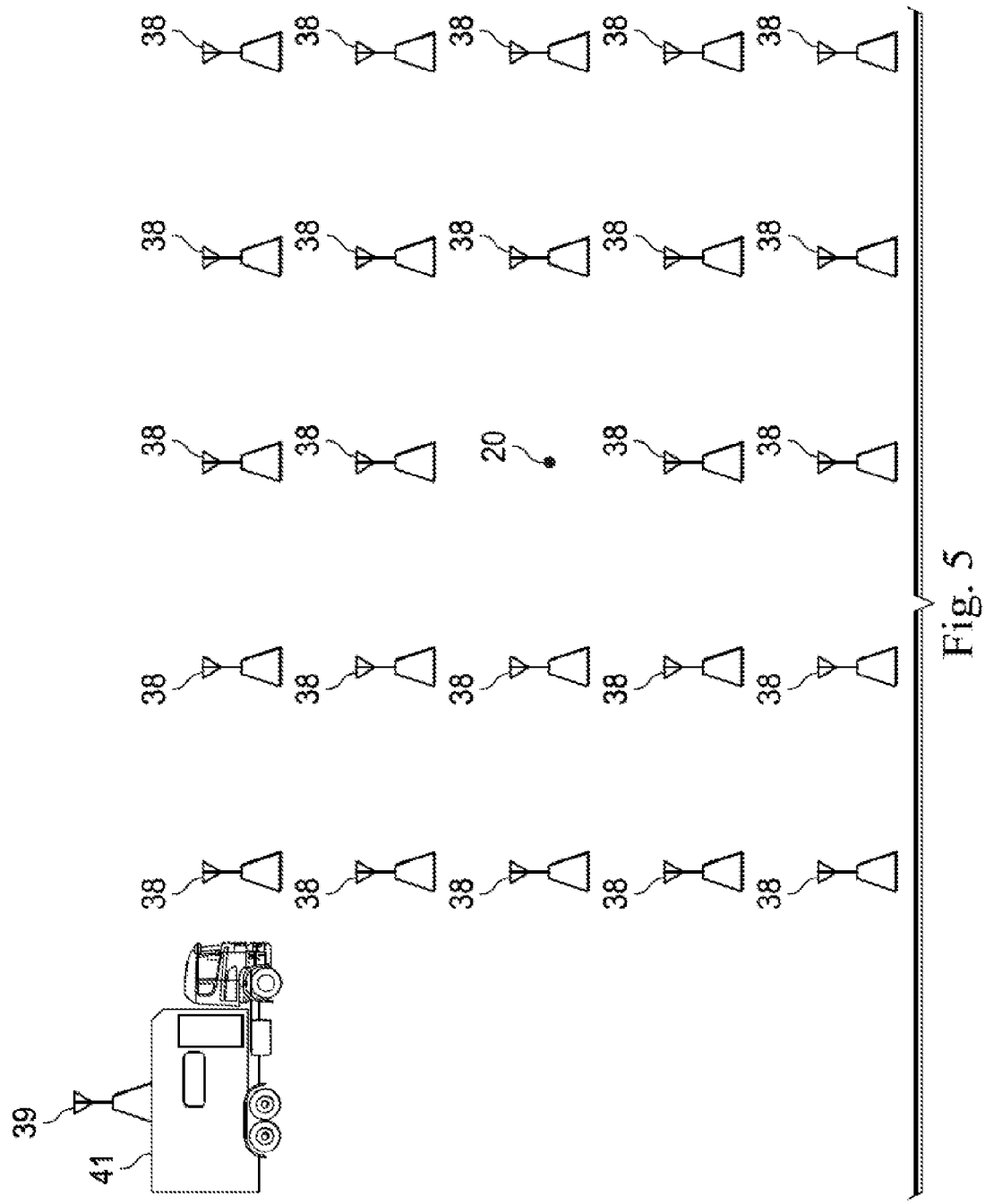

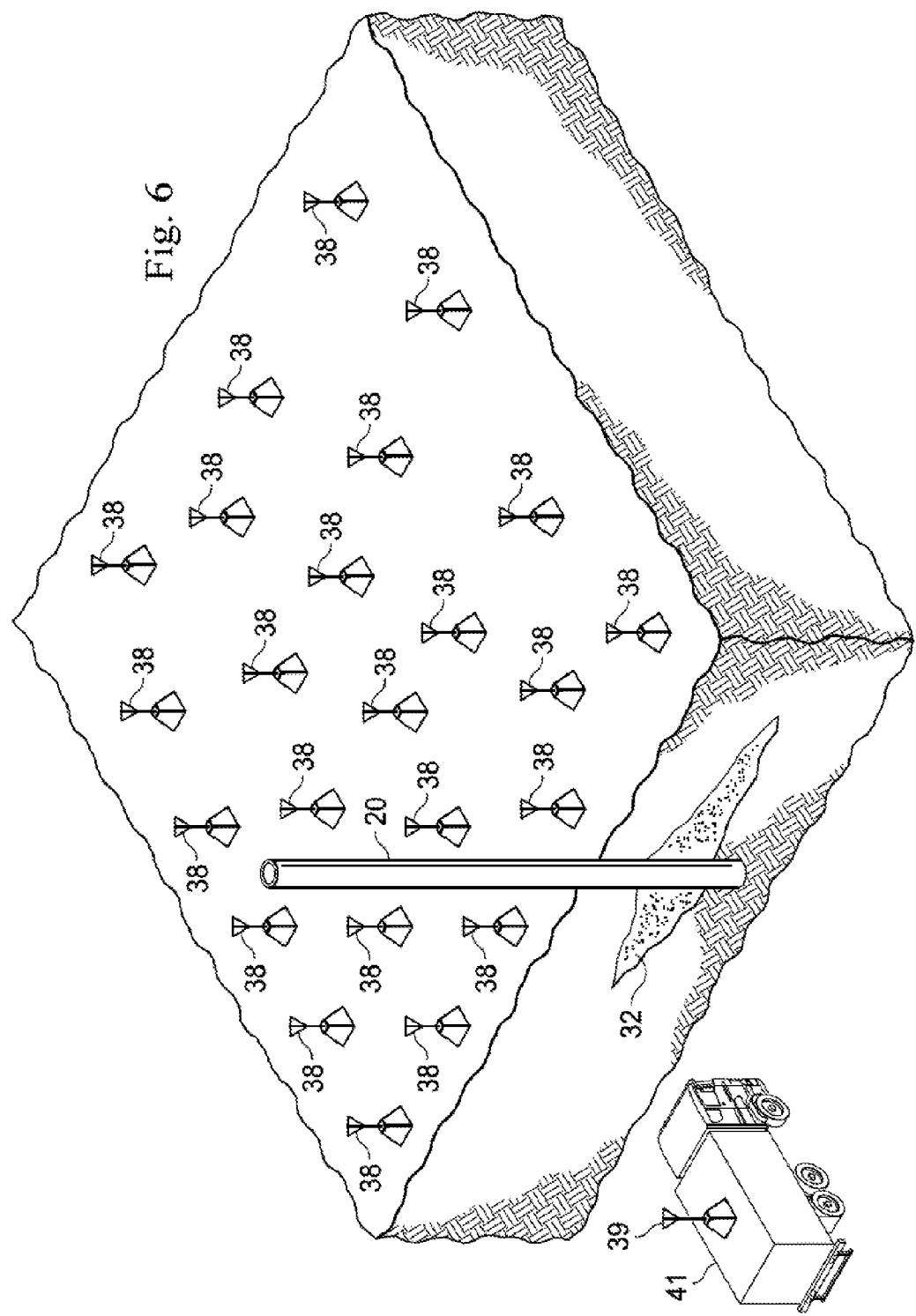

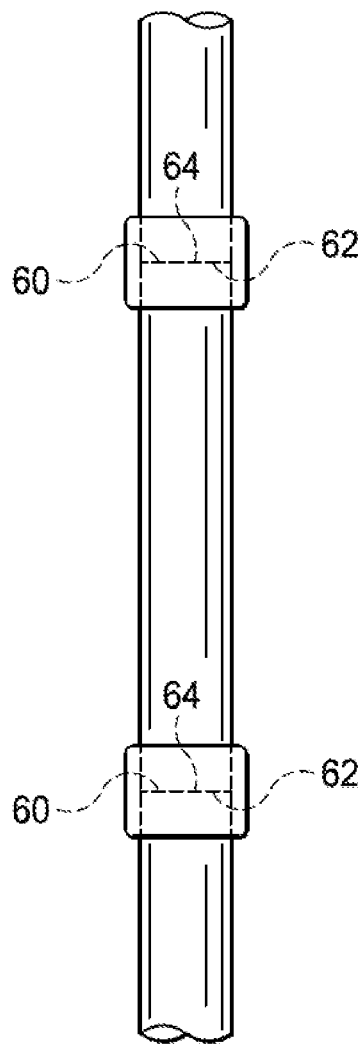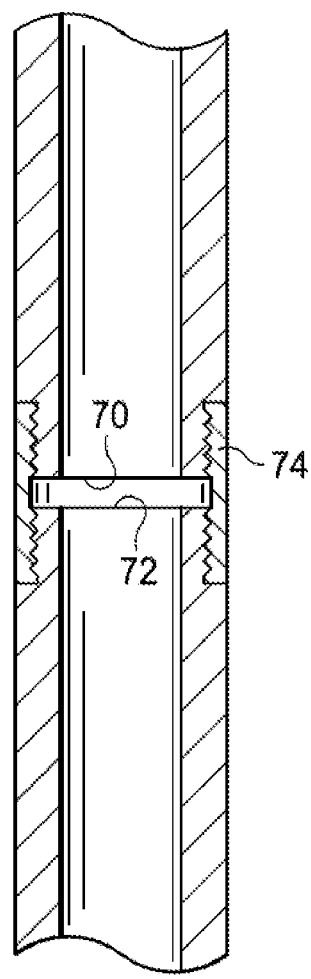

ELECTRICALLY CONDUCTIVE PROPPANT AND METHODS FOR DETECTING, LOCATING AND CHARACTERIZING THE ELECTRICALLY CONDUCTIVE PROPPANT

STATEMENT OF GOVERNMENTAL INTEREST

This invention was made under a CRADA (SC11/01780.00) between CARBO Ceramics, Inc. and Sandia National Laboratories, operated for the United States Department of Energy. The Government has certain rights in this invention.

BACKGROUND

Embodiments of the present invention relate generally to hydraulic fracturing of geological formations, and more particularly to electromagnetic (EM) methods for detecting, locating, and characterizing electrically conductive proppants used in the hydraulic fracture stimulation of gas, oil, or geothermal reservoirs. The methods described herein involve electrically energizing the earth at or near a fracture at the depth of the fracture and measuring the electric and magnetic field responses at the earth's surface or in adjacent wells/boreholes. Other embodiments of the present invention relate to compositions and methods for the formation of the electrically conductive proppants for use in the electromagnetic methods for detecting, locating and characterizing such proppants.

In order to stimulate and more effectively produce hydrocarbons from downhole formations, especially formations with low porosity and/or low permeability, induced fracturing (called "frac operations", "hydraulic fracturing", or simply "fracing") of the hydrocarbon-bearing formations has been a commonly used technique. In a typical frac operation, fluids are pumped downhole under high pressure, causing the formations to fracture around the borehole, creating high permeability conduits that promote the flow of the hydrocarbons into the borehole. These frac operations can be conducted in horizontal and deviated, as well as vertical, boreholes, and in either intervals of uncased wells, or in cased wells through perforations.

In cased boreholes in vertical wells, for example, the high pressure fluids exit the borehole via perforations through the casing and surrounding cement, and cause the formations to fracture, usually in thin, generally vertical sheet-like fractures in the deeper formations in which oil and gas are commonly found. These induced fractures generally extend laterally a considerable distance out from the wellbore into the surrounding formations, and extend vertically until the fracture reaches a formation that is not easily fractured above and/or below the desired frac interval. The directions of maximum and minimum horizontal stress within the formation determine the azimuthal orientation of the induced fractures. Normally, if the fluid, sometimes called slurry, pumped downhole does not contain solids that remain lodged in the fracture when the fluid pressure is relaxed, then the fracture re-closes, and most of the permeability conduit gain is lost.

These solids, called proppants, are generally composed of sand grains or ceramic particles, and the fluid used to pump these solids downhole is usually designed to be sufficiently viscous such that the proppant particles remain entrained in the fluid as it moves downhole and out into the induced fractures. Prior to producing the fractured formations, materials called "breakers", which are also pumped downhole in the frac fluid slurry, reduce the viscosity of the frac fluid after a desired time delay, enabling these fluids to be easily removed from the fractures during production, leaving the proppant particles in place in the induced fractures to keep them from closing and thereby substantially precluding production fluid flow there through.

The proppants may also be placed in the induced fractures with a low viscosity fluid in fracturing operations referred to as "water fracs" or "slick water fracs". The fracturing fluid in water fracs is water with little or no polymer or other additives. Water fracs are advantageous because of the lower cost of the fluid used. Also when using cross-linked polymers, it is essential that the breakers be effective or the fluid cannot be recovered from the fracture, effectively restricting flow of formation fluids. Water fracs, because the fluid is not cross-linked, do not rely on the effectiveness of breakers.

Commonly used proppants include naturally occurring sands, resin coated sands, and ceramic proppants. Ceramic proppants are typically manufactured from naturally occurring materials such as kaolin and bauxitic clays, and offer a number of advantages compared to sands or resin coated sands principally resulting from the compressive strength of the manufactured ceramics and their highly spherical particle shape.

Although induced fracturing has been a highly effective tool in the production of hydrocarbon reservoirs, the amount of stimulation provided by this process depends to a large extent upon the ability to generate new fractures, or to create or extend existing fractures, as well as the ability to maintain connection to the fractures through appropriate placement of the proppant. Without appropriate placement of the proppant, fractures generated during the hydraulic fracturing may tend to close, thereby diminishing the benefits of the hydraulic fracturing treatment. However, reliable methods for detecting, locating and characterizing the placement of proppant within fractures at relatively far distances from the wellbore and thus confirming whether or not such placement has been appropriate are not available.

Current state of the art proppant identification techniques are limited to relatively short distances (12 inches to 18 inches maximum) from the wellbore. Radioactive and non-radioactive tracers and proppants are currently used to infer the presence of proppant in the near well bore region. A better understanding of proppant placement in the far field regions of a hydraulic fracture is needed.

Previous work for massive hydraulic fracture mapping is summarized in Bartel, L. C., McCann, R. P., and Keck, L. J., Use of potential gradients in massive hydraulic fracture mapping and characterization, prepared for the 51st Annual Fall Technical Conference and Exhibition of Society of Petroleum Engineers, New Orleans, Oct. 3-6, 1976 paper SPE 6090. In this previous work, the electric potential differences were measured between two concentric circles of voltage electrodes around a vertical fracture well at the earth's surface. The well was electrically energized at the top of the well casing or at the depth of the fracture. The electrical ground was established at a well located at a distance of approximately one mile from the fracture well. At that time, the fact that the grounding wire acted as a transmitting antenna was not taken into account. The water used for the fracture process contained potassium chloride (KCl) to enhance its electrical conductivity and the fracture was propped using non-conducting sand. A 1 Hz repetition rate square wave input current waveform was used and only the voltage difference amplitudes were measured. Voltages using an elementary theory based on current leakage from the well casing and the fracture into a homogeneous earth were used to produce expected responses. Comparing the field data to results from the elementary model showed that a fracture orientation could be inferred, however, since the model did not account for the details of the fracture, other fracture properties could not be determined using the elementary model.

A method of detecting, locating and characterizing the location of the proppant as placed in a hydraulic fracture at distances of more than several inches from the cased wellbore is currently unavailable. Such a method for detecting, locating and characterizing the proppant material after the proppant material is placed in a fracture would be beneficial.

BRIEF DESCRIPTION OF THE DRAWINGS

The invention may best be understood by referring to the following description and accompanying drawings that are used to illustrate embodiments of the invention. In the drawings:

FIG. 5 is a schematic plan illustration of a hydraulic fracture mapping system.

FIG. 6 is a schematic perspective illustration of a hydraulic fracture mapping system.

FIG. 7A is a schematic illustration of an electrically insulated casing joint.

FIG. 7B is a schematic illustration of an electrically insulated casing collar.

DETAILED DESCRIPTION

Figure 1:
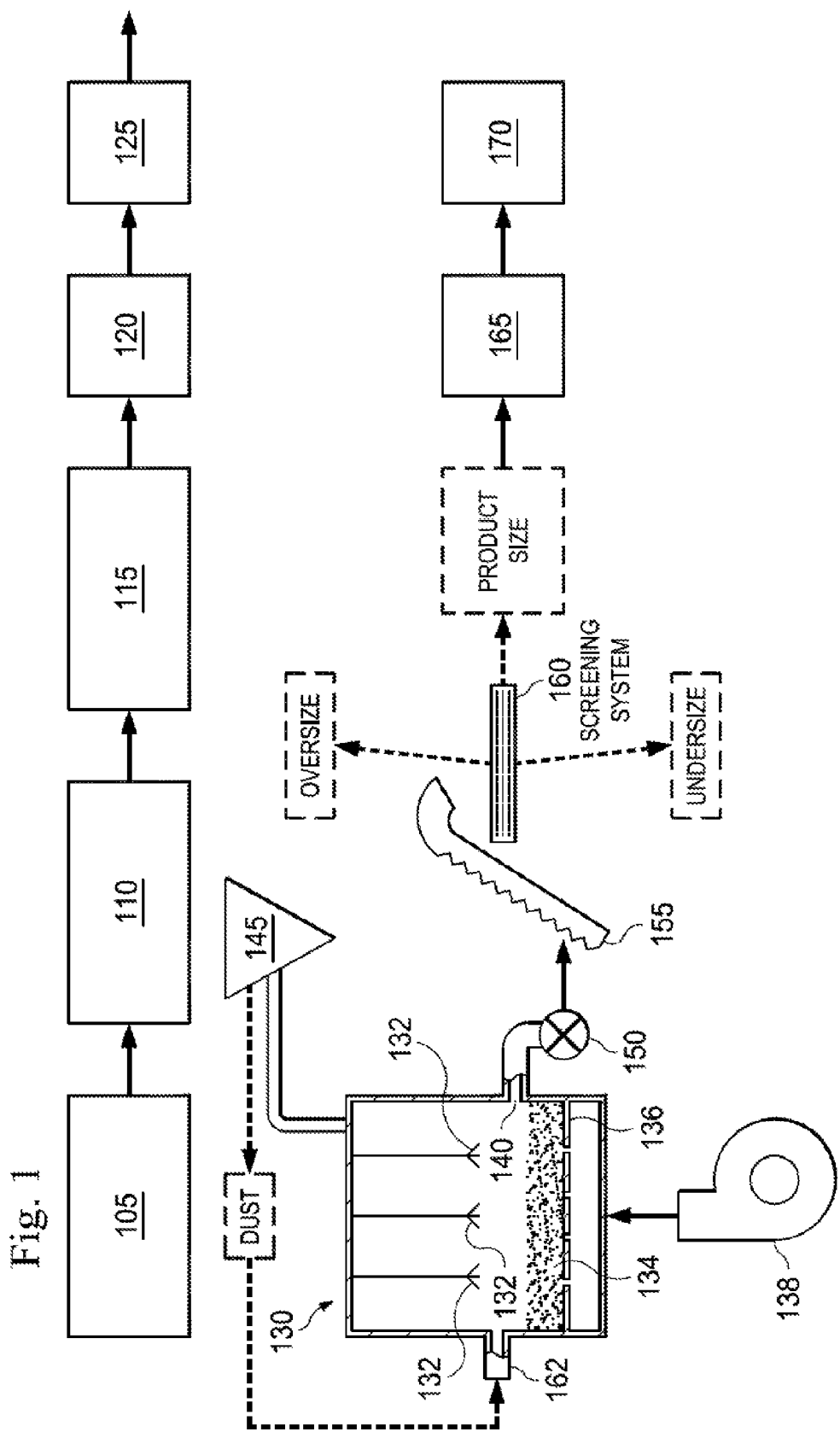
FIG. 1 is a schematic illustration of a system for preparing substantially round and spherical particles from a slurry as described herein.

In the following description, numerous specific details are set forth. However, it is understood that embodiments of the invention may be practiced without these specific details. In other instances, well-known structures and techniques have not been shown in detail in order not to obscure the understanding of this description.

Described herein are electromagnetic (EM) methods for detecting, locating, and characterizing electrically conductive proppants used in the hydraulic fracture stimulation of gas, oil, or geothermal reservoirs. Also described herein are electrically conductive sintered, substantially round and spherical particles and methods for preparing such electrically conductive sintered, substantially round and spherical particles from a slurry of an alumina containing raw material for use as proppants in the electromagnetic methods. The term "substantially round and spherical" and related forms, as used herein, is defined to mean an average ratio of minimum diameter to maximum diameter of about 0.8 or greater, or having an average sphericity value of about 0.8 or greater compared to a Krumbein and Sloss chart.

According to embodiments of the present invention, the electrically conductive sintered, substantially round and spherical particles, referred to hereinafter as "electrically conductive proppant" may be made from a conventional proppant such as a ceramic proppant, sand, plastic beads and glass beads. Such conventional proppants may be manufactured according to any suitable process including, but not limited to continuous spray atomization, spray fluidization, spray drying, or compression. Suitable conventional proppants and methods for their manufacture are disclosed in U.S. Pat. No. 4,068,718 (which recites on Col 6 lines 24-28 "The data in Table I, however, clearly shows that sintered bauxite particles having specific gravities between 3.50 and about 3.80 (sample 4) possess amble compressive strength for high stress service."), U.S. Pat. Nos. 4,427,068, 4,440,866, 5,188,175, and 7,036,591, the entire disclosures of which are incorporated herein by reference.

Ceramic proppants vary in properties such as apparent specific gravity by virtue of the starting raw material and the manufacturing process. The term "apparent specific gravity" as used herein is the weight per unit volume (grams per cubic centimeter) of the particles, including the internal porosity. Low density proppants generally have an apparent specific gravity of less than 3.0 g/cm$^3$ and are typically made from kaolin clay and other alumina, oxide, or silicate ceramics. Intermediate density proppants generally have an apparent specific gravity of about 3.1 to 3.4 g/cm$^3$ and are typically made from bauxitic clay. High strength proppants are generally made from bauxitic clays with alumina and have an apparent specific gravity above 3.4 g/cm$^3$.

An electrically conductive material such as a metal, a conductive polymer, or a conductive nanoparticle may be added in the manufacturing process of any one of these proppants to result in proppant suitable for use according to certain embodiments of the present invention. Suitable metals include aluminum, copper and nickel and can be added to result in a proppant having a metal content of from about 5% to about 10% by weight.

Suitable conductive polymers include poly(3,4-ethylenedioxythiophene) poly(styrenesulfonate) (PEDOT:PSS), polyanilines (PANI), and polypyrroles (PPY) and can be added to result in a proppant having a conductive polymer content of from about 0.1% to about 10% by weight. Suitable PEDOT:PSS, PANI and PYY conductive polymers are commercially available from Sigma-Aldrich. Certain specific embodiments of processes for coating proppant with a conductive polymer are described below in Example 2.

Suitable conducting nanoparticles include graphite, single or double-walled carbon nanotubes, or other material that when present in the nanoscale particle size range exhibits sufficient electrical conductivity to allow for detection in the present invention. Such conducting nanoparticles can be added to result in a proppant having a conducting nanoparticle content of from about 0.1% to about 10% by weight.

Ceramic proppant may also be manufactured in a manner that creates porosity in the proppant grain. A process to manufacture a suitable porous ceramic proppant is described in U.S. Pat. No. 7,036,591, the entire disclosure of which is incorporated herein by reference. In this case the electrically conductive material is impregnated into the pores of the proppant grains to a concentration of about 1% to 15% by weight.

Water soluble coatings such as polylactic acid can be used to coat these particles to allow for delayed/timed release of conducting nanoparticles for detection at different stages of the fracture treatment.

According to certain embodiments of the present invention, the electrically conductive material is coated onto the proppants. The coating may be accomplished by any coating technique well known to those of ordinary skill in the art such as spraying, sputtering, vacuum deposition, dip coating, extrusion, calendaring, powder coating, transfer coating, air knife coating, roller coating and brush coating.

According to certain embodiments of the present invention, the electrically conductive material is incorporated into a resin material and ceramic proppant or natural sands are coated with the resin material containing the electrically conductive material. Processes for resin coating proppants and natural sands are well known to those of ordinary skill in the art. For example, a suitable solvent coating process is described in U.S. Pat. No. 3,929,191, to Graham et al., the entire disclosure of which is incorporated herein by reference. Another suitable process such as that described in U.S. Pat. No. 3,492,147 to Young et al., the entire disclosure of which is incorporated herein by reference, involves the coating of a particulate substrate with a liquid, uncatalyzed resin composition characterized by its ability to extract a catalyst or curing agent from a non-aqueous solution. Also a suitable hot melt coating procedure for utilizing phenol-formaldehyde novolac resins is described in U.S. Pat. No. 4,585,064, to Graham et al, the entire disclosure of which is incorporated herein by reference. Those of ordinary skill in the art will be familiar with still other suitable methods for resin coating proppants and natural sands.

As described herein, sintered, substantially round and spherical particles are prepared from a slurry of alumina-containing raw material. In certain embodiments, the particles have an alumina content of from about 40% to about 55% by weight. In certain other embodiments, the sintered, substantially round and spherical particles have an alumina content of from about 41.5% to about 49% by weight.

In certain embodiments, the sintered, substantially round and spherical particles have a bulk density of from about 1.35 g/cm$^3$ to about 1.55 g/cm$^3$. The term "bulk density", as used herein, refers to the weight per unit volume, including in the volume considered, the void spaces between the particles. In certain other embodiments, the particles have a bulk density of from about 1.40 g/cm$^3$ to about 1.50 g/cm$^3$.

In certain embodiments, the sintered, substantially round and spherical particles have a crush strength at 10,000 psi of from about 5% to about 8.5%, and a long term fluid conductivity at 10,000 psi of from about 2500 mD-ft to about 3000 mD-ft. in certain other embodiments, the sintered, substantially round and spherical particles have a crush strength at 10,000 psi of from about 5% to about 7.5%.

In still other embodiments, the sintered, substantially round and spherical particles have an apparent specific gravity of from about 2.50 to about 3.00. The term "apparent specific gravity," (ASG) as used herein, refers to a number without units that is defined to be numerically equal to the weight in grams per cubic centimeter of volume, including void space or open porosity in determining the volume.

According to other embodiments, the sintered, substantially round and spherical particles have a size of from about 20 to about 40 U.S. Mesh.

According to certain embodiments described herein, the sintered, substantially round and spherical particles are made in a continuous process, while in other embodiments, the particles are made in a batch process.

Referring now to FIG. 1, an exemplary system for implementing a continuous process for preparing sintered, substantially round and spherical particles from a slurry is illustrated. The exemplary system illustrated in FIG. 1 is similar in configuration and operation to that described in U.S. Pat. No. 4,440,866, the entire disclosure of which is incorporated herein by reference. The operations performed by the exemplary system illustrated in FIG. 1 can also be used to make the particles according to a batch process, as described in Example 1 below.

In the system illustrated in FIG. 1, an alumina-containing raw material having an alumina content of from about 40% to about 55% by weight (on a calcined basis) is passed through a shredder 105 which slices and breaks apart the raw material into small chunks, in some embodiments, when the raw material as mined, or as received, (referred to herein as "untreated" raw material) is of such consistency that it can be processed as described herein without shredding, the shredder may be bypassed. Raw material fed through a shredder such as is illustrated in FIG. 1, is referred to as "treated" raw material.

In certain embodiments, the shredder breaks apart and slices the alumina-containing raw material so as to yield pieces having a diameter of less than about five inches, although pieces having smaller and larger diameters can be further processed into a slurry as described herein. Shredders and numerous other devices for slicing, chopping or comminuting the alumina-containing raw material, as well as commercial sources for same, such as the Gleason Foundry Company, are well known to those of ordinary skill in the art.

The treated or untreated alumina-containing raw material and water are fed to a blunger 110, which has a rotating blade that imparts a shear force to and further reduces the particle size of the raw material to form a slurry. In a continuous process, the raw material and water are continuously fed to the blunger. Blungers and similar devices for making slurries of such materials, as well as commercial sources for same are well known to those of ordinary skill in the art.

In certain embodiments, the electrically conductive material is added to the alumina-containing raw material and water in the blunger 110 to result in an electrically conductive material concentration of about 5% to about 10% by weight of the solids content in the slurry or just prior to the formation of pellets as described below.

A sufficient amount of water is added to the blunger 110 to result in a slurry having a solids content in the range of from about 40% to about 60% by weight. In certain embodiments, a sufficient amount of water is added to the slurry such that the solids content of the slurry is from about 45% to about 55% by weight. In still other embodiments, a sufficient amount of water is added to the slurry such that the solids content of the slurry is about 50% by weight. The water added to the blunger 110 can be fresh water or deionized water. In a continuous process for preparing the slurry, the solids content of the slurry is periodically analyzed and the amount of water fed to the slurry adjusted to maintain the desired solids content. Methods for analyzing the solids content of a slurry and adjusting a feed of water are well known and understood by those of ordinary skill in the art.

In certain embodiments, a dispersant is added to the slurry in the blunger 110 to adjust the viscosity of the slurry to a target range as discussed further below. In other embodiments, the viscosity of the slurry in the blunger 110 is adjusted to the target range by the addition of a dispersant and a pH-adjusting reagent.

A dispersant may be added to the slurry prior to the addition of the electrically conductive material or other additives. In certain embodiments, the composition includes a dispersant in an amount of from about 0.15% to about 0.30% by weight based on the dry weight of the alumina-containing raw material.

Exemplary materials suitable for use as a dispersant in the compositions and methods described herein include but are not limited to sodium polyacrylate, ammonium polyacrylate, ammonium polymethacrylate, tetra sodium pyrophosphate, tetra potassium pyrophosphate, polyphosphate, ammonium polyphosphate, ammonium citrate, ferric ammonium citrate, and polyelectrolytes such as a composition of ammonium polymethacrylate and water commercially available from a variety of sources, such as, Kemira Chemicals under the trade name C-211, Phoenix Chemicals, Bulk Chemical Systems under the trade name BCS 4020 and R.T. Vanderbilt Company, Inc, under the trade name DARVAN C. Generally, the dispersant can be any material that will adjust the viscosity of the slurry to a target viscosity such that the slurry can be subsequently processed through one or more pressure nozzles of a fluidizer. In certain embodiments, the target viscosity is less than 150 centipoises (cps) (as determined on a Brookfield Viscometer with a #61 spindle). In other embodiments, the target viscosity is less than 100 cps.

According to embodiments in which a pH-adjusting reagent is used, a sufficient amount of a pH-adjusting reagent is added to the slurry to adjust the pH of the slurry to a range of from about 8 to about 11. In certain embodiments, a sufficient amount of the pH-adjusting reagent is added to the slurry to adjust the pH to about 9, about 9.5, about 10 or about 10.5. The pH of the slurry can be periodically analyzed by a pH meter, and the amount of pH-adjusting reagent fed to the slurry adjusted to maintain a desired pH. Methods for analyzing the pH of a slurry and adjusting the feed of the pH-adjusting reagent are within the ability of those of ordinary skill in the art. Exemplary materials suitable for use as a pH-adjusting reagent in the compositions and methods described herein include but are not limited to ammonia and sodium carbonate.

Generally, the target viscosity of the compositions is a viscosity that can be processed through a given type and size of pressure nozzle in a fluidizer, without becoming clogged. Generally, the lower the viscosity of the slurry, the more easily it can be processed through a given fluidizer. However, the addition of too much dispersant can cause the viscosity of the slurry to increase to a point that it cannot be satisfactorily processed through a given fluidizer. One of ordinary skill in the art can determine the target viscosity for given fluidizer types through routine experimentation.

The blunger 110 mixes the alumina-containing raw material, electrically conductive material, water, dispersant and pH-adjusting reagent until a slurry is formed. The length of time required to form a slurry is dependent on factors such as the size of the blunger, the speed at which the blunger is operating, and the amount of material in the blunger.

From the blunger 110, the slurry is fed to a tank 115, where the slurry is continuously stirred, and a binder is added in an amount of from about 0.2% to about 5.0% by weight, based on the total dry weight of the alumina-containing raw material and the electrically conductive material. In certain embodiments, the binder is added in an amount of from about 0.2% to about 3.0% by weight based on the total dry weight of the alumina-containing raw material and the electrically conductive material. Suitable binders include but are not limited to polyvinyl acetate, polyvinyl alcohol (PVA), methylcellulose, dextrin and molasses. In certain embodiments, the binder is PVA having a molecular weight of from about 20,000 to 100,000 Mn. "Mn" represents the number average molecular weight which is the total weight of the polymeric molecules in a sample, divided by the total number of polymeric molecules in that sample.

The tank 115 maintains the slurry created by the blunger 110. However, the tank 115 stirs the slurry with less agitation than the blunger, so as to mix the binder with the slurry without causing excessive foaming of the slurry or increasing the viscosity of the slurry to an extent that would prevent the slurry from being fed through the pressurized nozzles of a fluidizer.

In another embodiment, the binder can be added to the slurry while in the blunger. In this embodiment, the blunger optionally has variable speeds, including a high speed to achieve the high intensity mixing fir breaking down the raw material into a slurry form, and a low speed to mix the binder with the slurry without causing the above-mentioned excessive foaming or increase in viscosity.

Referring again to the tank 115 illustrated in FIG. 1, the slurry is stirred in the tank, after addition of the binder, for a time sufficient to thoroughly mix the binder with the slurry. In certain embodiments, the slurry is stirred in the tank for up to about 30 minutes following the addition of binder. In other embodiments, the slurry is stirred in the tank 115 for at least about 30 minutes. In still other embodiments, the slurry is stirred in the tank for more than about 30 minutes after addition of the binder.

Tank 115 can also be a tank system comprised of one, two, three or more tanks. Any configuration or number of tanks that enables the thorough mixing of the binder with the slurry is sufficient. In a continuous process, water, and one or more of dust, oversize particles, or undersize particles from a subsequent fluidizer or other apparatus can be added to the slurry in the tank 115.

From the tank 115, the slurry is fed to a heat exchanger 120, which heats the slurry to a temperature of from about 25° C. to about 90° C. From the heat exchanger 120, the slurry is fed to a pump system 125, which feeds the slurry, under pressure, to a fluidizer 130.

A grinding mill(s) and/or a screening system(s) (not illustrated) can be inserted at one or more places in the system illustrated in FIG. 1 prior to feeding the slurry to the fluidizer to assist in breaking any larger-sized alumina-containing raw material down to a target size suitable for feeding to the fluidizer. In certain embodiments, the target size is less than 230 mesh. In other embodiments, the target size is less than 325 mesh, less than 270 mesh, less than 200 mesh or less than 170 mesh. The target size is influenced by the ability of the type and/or size of the pressure nozzle in the subsequent fluidizer to atomize the slurry without becoming clogged.

If a grinding system is employed, it is charged with a grinding media suitable to assist in breaking the raw material down to a target size suitable for subsequent feeding through one or more pressure nozzles of a fluidizer. If a screening system is employed, the screening system is designed to remove particles larger than the target size from the slurry. For example, the screening system can include one or more screens, which are selected and positioned so as to screen the slurry to particles that are smaller than the target size.

Referring again to FIG. 1, fluidizer 130 is of conventional design, such as described in, for example, U.S. Pat. No. 3,533,829 and U.K. Patent No. 1,401,303. Fluidizer 130 includes at least one atomizing nozzle 132 (three atomizing nozzles 132 being shown in FIG. 1), which is a pressure nozzle of conventional design. In other embodiments, one or more two-fluid nozzles are suitable. The design of such nozzles is well known, for example from K. Masters: "Spray Drying Handbook", John Wiley and Sons, New York (1979).

Fluidizer 130 further includes a particle bed 134, which is supported by a plate 136, such as a perforated, straight or directional plate. Hot air flows through the plate 136. The particle bed 134 comprises seeds from which green pellets of a target size can be grown. The term "green pellets" and related forms, as used herein, refers to substantially round and spherical particles which have been formed from the slurry but are not sintered. When a perforated or straight plate is used, the seeds also serve to obtain plug flow in the fluidizer. Plug flow is a term known to those of ordinary skill in the art, and can generally be described as a flow pattern where very little back mixing occurs. The seed particles are smaller than the target size for green pellets made according to the present methods. In certain embodiments, the seed comprises from about 5% to about 20% of the total volume of a green pellet formed therefrom. Slurry is sprayed, under pressure, through the atomizing nozzles 132, and the slurry spray coats the seeds to form green pellets that are substantially round and spherical.

External seeds can be placed on the perforated plate 136 before atomization of the slurry by the fluidizer begins. If external seeds are used, the seeds can be prepared in a slurry process similar to that illustrated in FIG. 1, where the seeds are simply taken from the fluidizer at a target seed size. External seeds can also be prepared in a high intensity mixing process such as that described in U.S. Pat. No. 4,879,181, the entire disclosure of which is hereby incorporated by reference.

According to certain embodiments, external seeds are made from either a raw material having at least the same alumina content as the raw material used to make the slurry, or from a raw material having more or less alumina than the raw material used to make the slurry. In certain embodiments, the slurry has an alumina content that is at least 10%, at least 20%, or at least 30% less than that of the seeds. In other embodiments, the external seeds have an alumina content less than that of the slurry, such as at least 10%, at least 20%, or at least 30% less than that of the slurry.

Alternatively, seeds for the particle bed are formed by the atomization of the slurry, thereby providing a method by which the slurry "self-germinates" with its own seed. According to one such embodiment, the slurry is fed through the fluidizer 130 in the absence of a seeded particle bed 134. The slurry droplets exiting the nozzles 132 solidify, but are small enough initially that they get carried out of the fluidizer 130 by air flow and caught as "dust" (fine particles) by a dust collector 145, which may, for instance, be an electrostatic precipitator, a cyclone, a bag filter, a wet scrubber or a combination thereof. The dust from the dust collector is then fed to the particle bed 134 through dust inlet 162, where it is sprayed with slurry exiting the nozzles 132. The dust may be recycled a sufficient number of times, until it has grown to a point where it is too large to be carried out by the air flow and can serve as seed. The dust can also be recycled to another operation in the process, for example, the tank 115.

Referring again to FIG. 1, hot air is introduced to the fluidizer 130 by means of a fan and an air heater, which are schematically represented at 138. The velocity of the hot air passing through the particle bed 134 is from about 0.9 meters/second to about 1.5 meters/second, and the depth of the particle bed 134 is from about 2 centimeters to about 60 centimeters. The temperature of the hot air when introduced to the fluidizer 130 is from about 250° C. to about 650° C. The temperature of the hot air as it exits from the fluidizer 130 is less than about 250° C., and in some embodiments is less than about 100° C.

The distance between the atomizing nozzles 132 and the plate 136 is optimized to avoid the formation of dust which occurs when the nozzles 132 are too far away from the plate 126 and the formation of irregular, coarse particles which occurs when the nozzles 132 are too close to the plate 136. The position of the nozzles 132 with respect to the plate 136 is adjusted on the basis of an analysis of powder sampled from the fluidizer 130.

The green pellets formed by the fluidizer accumulate in the particle bed 134. In a continuous process, the green pellets formed by the fluidizer 130 are withdrawn through an outlet 140 in response to the level of product in the particle bed 134 in the fluidizer 130, so as to maintain a given depth in the particle bed. A rotary valve 150 conducts green pellets withdrawn from the fluidizer 130 to an elevator 155, which feeds the green pellets to a screening system 160, where the green pellets are separated into one or more fractions, for example, an oversize fraction, a product fraction, and an undersize fraction.

The oversize fraction exiting the screening unit 160 includes those green pellets that are larger than the desired product size. In a continuous process, the oversize green pellets may be recycled to tank 115, where at least some of the oversize green pellets can be broken down and blended with slurry in the tank. Alternatively, oversize green pellets can be broken down and recycled to the particle bed 134 in the fluidizer 130. The undersize fraction exiting the screening system 160 includes those green pellets that are smaller than the desired product size. In a continuous process, these green pellets may be recycled to the fluidizer 130, where they can be fed through an inlet 162 as seeds or as a secondary feed to the fluidizer 130.

The product fraction exiting the screening system 160 includes those green pellets having the desired product size. These green pellets are sent to a pre-sintering device 165, for example, a calciner, where the green pellets are dried or calcined prior to sintering. In certain embodiments, the green pellets are dried to a moisture content of less than about 18% by weight, or less than about 15% by weight, about 12% by weight, about 10% by weight, about 5% by weight, or about 1% by weight.

After drying and/or calcining, the green pellets are fed to a sintering device 170, in which the green pellets are sintered for a period of time sufficient to enable recovery of sintered, substantially round and spherical particles having one or more of a desired apparent specific gravity, bulk density, and crush strength. Alternatively, the pre-sintering device 165 can eliminated if the sintering device 170 can provide sufficient calcining and/or drying conditions (i.e., drying times and temperatures that dry the green pellets to a target moisture content prior to sintering), followed by sufficient sintering conditions.

The specific time and temperature to be employed for sintering is dependent on the starting ingredients and the desired density for the sintered particles. In some embodiments, sintering device 170 is a rotary kiln, operating at a temperature of from about 1000° C. to about 1600° C., for a period of time from about 5 to about 90 minutes. In certain embodiments, a rotary kiln is operated at a temperature of about 1000° C., about 1200° C., about 1300° C., about 1400° C. or about 1500° C. In certain embodiments, the green pellets have a residence time in the sintering device of from about 50 minutes to about 70 minutes, or from about 30 minutes to about 45 minutes. After the particles exit the sintering device 170, they can be further screened for size, and tested for quality control purposes. Inert atmosphere sintering can be used to limit or prevent the oxidation of the electrically conductive material. Techniques for replacing the oxygen rich atmosphere in the sintering device with an inert gas such as argon, nitrogen, or helium are well known to those of ordinary skill in the art. Generally, oxygen is replaced with an inert gas such that 0.005% oxygen or less remains in the sintering atmosphere.

Figure 2:
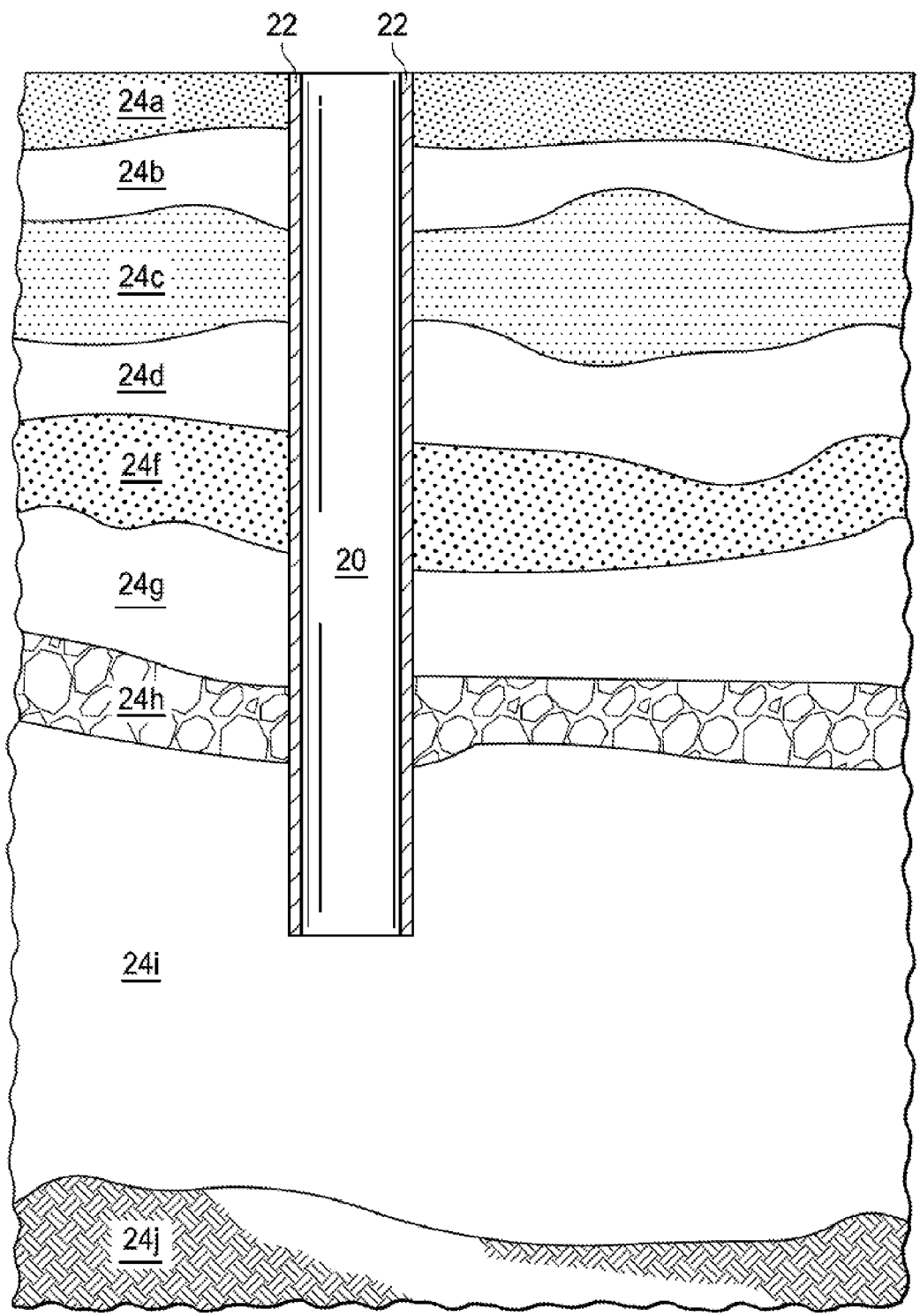
FIG. 2 is a diagram of the geometric layout of a vertical or deviated well in which layers of the earth having varying electrical and mechanical properties are depicted.

The electromagnetic methods described herein involve electrically energizing the earth at or near a fracture at depth and measuring the electric and magnetic responses at the earth's surface or in adjacent wells/boreholes. The electromagnetic methods described herein are typically used in connection with a cased wellbore, such as well 20 shown in FIG. 2. Specifically, casing 22 extends within well 20 and well 20 extends through geological strata 24a-24i in a manner that has three dimensional components.

Figure 3:
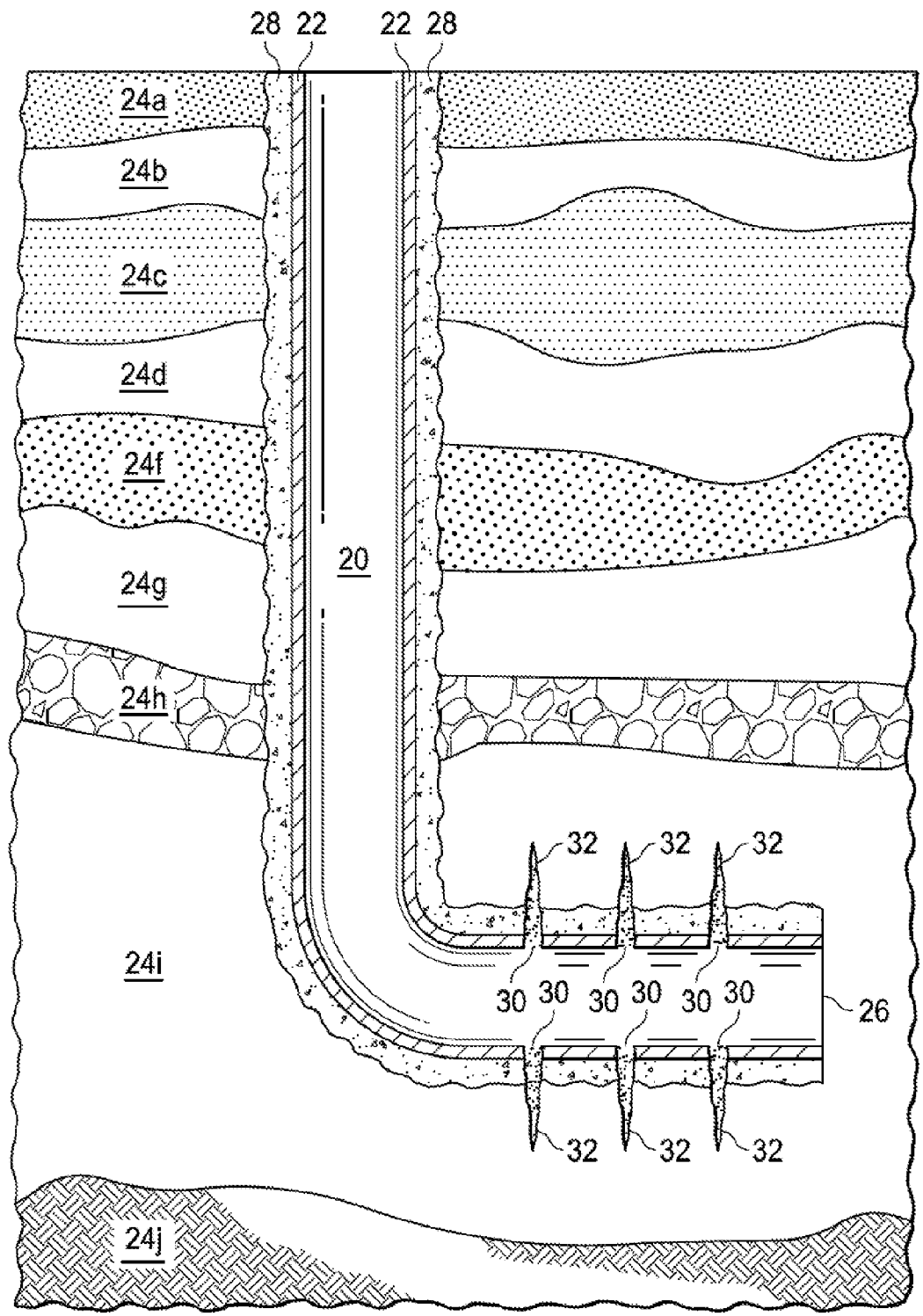
FIG. 3 is a schematic of an installed horizontal wellbore casing string traversing a hydrocarbon bearing zone with proppant filled fractures in which layers of the earth having varying electrical and mechanical properties are depicted.

Referring now to FIG. 3, a partial cutaway view is shown with production well 20 extending vertically downward through one or more geological layers 24a-24i and horizontally in layer 24i. White wells are conventionally vertical, the electromagnetic methods described herein are not limited to use with vertical wells. Thus, the terms "vertical" and "horizontal" are used in a general sense in their reference to wells of various orientations.

The preparation of production well 20 for hydraulic fracturing typically comprises drilling a bore 26 to a desired depth and then in some cases extending the bore 26 horizontally so that the bore 26 has any desired degree of vertical and horizontal components. Casing 22 is cemented 28 into well 20 to seal the bore 26 from the geological layers 24a-24i in FIG. 3. The casing 22 has a plurality of perforations 30. The perforations 30 are shown in FIG. 3 as being located in a horizontal portion of well 20 but those of ordinary skill in the art will recognize that the perforations can be located at any desired depth or horizontal distance along the bore 26, but are typically at the location of a hydrocarbon bearing zone in the geological layers 24, which may be within one or more of the geological layers 24a-24j. The hydrocarbon bearing zone may contain oil and/or gas, as well as other fluids and materials that have fluid-like properties. The hydrocarbon bearing zone in geological layers 24a-24j is hydraulically fractured by pumping a fluid into casing 22 and through perforations 30 at sufficient rates and pressures to create fractures 32 and then incorporating into the fluid an electrically conducting proppant which will prop open the created fractures 32 when the hydraulic pressure used to create the fractures 32 is released.

The hydraulic fractures 32 shown in FIG. 3 are oriented radially away from the metallic well casing 22. This orientation is exemplary in nature. In practice, hydraulically-induced fractures 32 may be oriented radially as in FIG. 3, laterally or intermediate between the two. Various orientations are exemplary and not intended to restrict or limit the electromagnetic methods described herein in any way.

According to certain embodiments of the electromagnetic method of the present invention and as shown schematically in FIG. 4, electric current is carried down wellbore 20 to an energizing point which will generally be located within 10 meters or more (above or below) of perforations 30 in casing 22 via a seven strand wire line insulated cable 34, such as those which are well known to those of ordinary skill in the art and are widely commercially available from Camesa Wire, Rochester Wire and Cable, Inc., WireLine Works, Novametal Group, and Quality Wireline & Cable Inc. A sinker bar 36 connected to the wire line cable 34 contacts or is in close proximity to the well casing 22 whereupon the well casing 22 becomes a current line source that produces subsurface electric and magnetic fields. These fields interact with the fracture 32 containing electrically conducting proppant to produce secondary electric and magnetic fields that will be used to detect, locate, and characterize the proppant-filled fracture 32.

Figure 4:
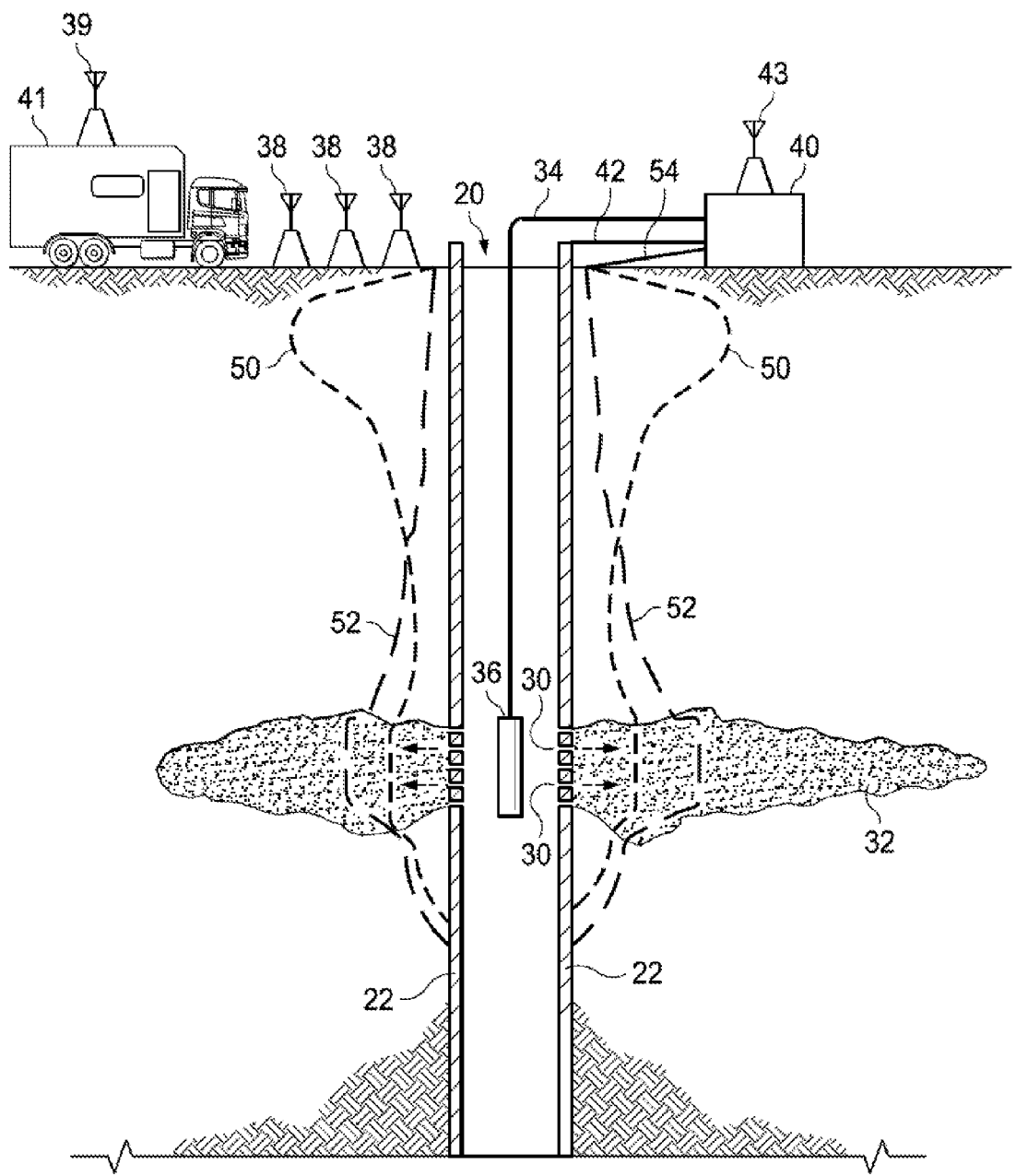
FIG. 4 is a schematic cross-sectional illustration of a hydraulic fracture mapping system which depicts two embodiments for introducing electric current into a wellbore, namely energizing the wellbore at the surface and energizing via a wireline with a sinker bar near perforations in the wellbore.

According to certain embodiments of the electromagnetic method of the present invention and as shown schematically in FIG. 4, a power control box 40 is connected to casing 22 by a cable 42 so that electric current is injected into the fracture well 20 by directly energizing the casing 22 at the well head. In one embodiment, the power control box 40 is connected wirelessly by a receiver/transmitter 43 to a receiver/transmitter 39 on equipment truck 41. Those of ordinary skill in the art will recognize that other suitable means of carrying the current to the energizing point may also be employed.

As shown schematically in FIGS. 4-6, a plurality of electric and magnetic field sensors 38 will be located on the earth's surface in a rectangular or other suitable array covering the area around the fracture well 20 and above the anticipated fracture 32. In one embodiment, the sensors 38 are connected wirelessly to a receiver/transmitter 39 on equipment truck 41. The maximum dimension of the array (aperture) in general should be at least 80 percent of the depth to the fracture zone. The sensors 38 will measure the x, y and z component responses of the electric and magnetic fields. It is these responses that will be used to infer location and characterization of the electrically conducting proppant through comparison to numerical simulations and/or inversion of the measured data to determine the source of the responses. The responses of the electric and magnetic field components will depend upon: the orientation of the fracture well 20, the orientation of the fracture 32, the electrical conductivity, magnetic permeability, and electric permittivity of layers 24a-24j, the electrical conductivity, magnetic permeability, and electric permittivity of the proppant filled fracture 32, and the volume of the proppant filled fracture 32. Moreover, the electrical conductivity, magnetic permeability and electric permittivity of the geological layers residing between the surface and the target formation layers 24a-24j influence the recorded responses. From the field-recorded responses, details of the proppant filled fracture 32 can be determined.

In another embodiment, electric and magnetic sensors may be located in adjacent well/boreholes.

Depending upon the conductivity of the earth surrounding the well casing 22, the current may or may not be uniform as the current flows back to the surface along the well casing 22. According to both embodiments shown in FIG. 4, current leakage occurs along wellbore 20 such as along path 50 or 52 and returns to the electrical ground 54 which is established at the well head. As described in U.S. patent application Ser. No. 13/206,041 filed Aug. 9, 2011 and entitled "Simulating Current Flow Through a Well Casing and an Induced Fracture," the entire disclosure of which is incorporated herein by reference, the well casing is represented as a leaky transmission line in data analysis and numerical modeling. Numerical simulations have shown that for a conducting earth (conductivity greater than approximately 0.05 siemens per meter (S/m)), the current will leak out into the formation, while if the conductivity is less than approximately 0.05 S/m the current will be more-or-less uniform along the well casing 22. As shown in FIGS. 7A and 7B, to localize the current in the well casing 22, electrically insulating pipe joints or pipe collars may be installed. According to the embodiment shown in FIG. 7A, an insulating joint may be installed by coating the mating surfaces 60 and 62 of the joint with a material 64 having a high dielectric strength, such as any one of the well-known and commercially available plastic or resin materials which have a high dielectric strength and which are of a tough and flexible character adapted to adhere to the joint surfaces so as to remain in place between the joint surfaces. As described in U.S. Pat. No. 2,940,787, the entire disclosure of which is incorporated herein by reference, such plastic or resin materials include epoxies, phenolics, rubber compositions, and alkyds, and various combinations thereof. Additional materials include polyetherimide and modified polyphenylene oxide. According to the embodiment shown in FIG. 7B, the mating ends 70 and 72 of the joint are engaged with an electrically insulated casing collar 74. The transmission line representation is able to handle various well casing scenarios, such as vertical only, slant wells, vertical and horizontal sections of casing, and, single or multiple insulating gaps.

The detection, location, and characterization of the electrically conducting proppant in a fracture will depend upon several factors, including but not limited to the net electrical conductivity of the fracture, fracture volume, the electrical conductivity, magnetic permeability, and electric permittivity of the earth surrounding the fracture and between the fracture and surface mounted sensors. The net electrical conductivity of the fracture means the combination of the electrical conductivity of the fracture, the proppant and the fluids when all are placed in the earth minus the electrical conductivity of the earth formation when the fracture, proppant and fluids were not present. Also, the total electrical conductivity of the proppant filled fracture is the combination of the electrical conductivity created by making a fracture, plus the electrical conductivity of the new/modified proppant plus the electrical conductivity of the fluids, plus the electro-kinetic effects of moving fluids through a porous body such as a proppant pack. The volume of an overly simplified fracture with the geometric form of a plane may be determined by multiplying the height, length, and width (i.e. gap) of the fracture. A three dimensional (3D) finite-difference electromagnetic algorithm that solves Maxwell's equations of electromagnetism may be used for numerical simulations. In order for the electromagnetic response of a proppant filled fracture at depth to be detectable at the Earth's surface, the net fracture conductivity multiplied by the fracture volume within one computational cell of the finite difference (ED) grid must be larger than approximately 100 $Sm^2$ for a Barnett shale-like model where the total fracture volume is approximately 38 $m^3$. For the Barnett shale model, the depth of the fracture is 2000 m. These requirements for the numerical simulations can be translated to properties in a field application for formations other than the Barnett shale.

The propagation and/or diffusion of electromagnetic (EM) wavefields through three-dimensional (3D) geological media are governed by Maxwell's equations of electromagnetism.

According to one embodiment of the present invention, the measured three dimensional components of the electric and magnetic field responses may be analyzed with imaging methods such as an inversion algorithm based on Maxwell's equations and electromagnetic migration and/or holography to determine proppant pack location. Inversion of acquired data to determine proppant pack location involves adjusting the earth model parameters, including but not limited to the proppant location within a fracture or fractures and the net electrical conductivity of the fracture, to obtain the best fit to forward model calculations of responses for an assumed earth model. As described in Bartel, L. C., Integral wave-migration method applied to electromagnetic data, Sandia National Laboratories, 1994, the electromagnetic integral wave migration method utilizes Gauss's theorem where the data obtained over an aperture is projected into the subsurface to form an image of the proppant pack. Also, as described in Bartel, L. C., Application of EM Holographic Methods to Borehole Vertical Electric Source Data to Map a Fuel Oil Spill, Sandia National Laboratories, 1993, the electromagnetic holographic method is based on the seismic holographic method and relies on constructive and destructive interferences where the data and the source wave form are projected into an earth volume to form an image of the proppant pack. Due to the long wave lengths of the low frequency electromagnetic responses for the migration and holographic methods, it may be necessary to transform the data into another domain where the wave lengths are shorter. As described in Lee, K. H., et al., A new approach to modeling the electromagnetic response of conductive media, Geophysics, Vol. 54, No. 9 (1989), this domain is referred to as the q-domain. Further, as described in Lee, et al., Tomographic imaging of Electrical Conductivity Using Low-Frequency Electromagnetic Fields, Lawrence Berkeley Lab, 1992, the wave length changes when the transformation is applied.

Also, combining Maxwell's equations of electromagnetism with constitutive relations appropriate for time-independent isotropic media yields a system of six coupled first-order partial differential equations referred to as the "EH" system. The name derives from the dependent variables contained therein, namely the electric vector E and the magnetic vector H. Coefficients in the EH system are the three material properties, namely electrical current conductivity, magnetic permeability, and electric permittivity. All of these parameters may vary with 3D spatial position. The inhomogeneous terms in the EH system represent various body sources of electromagnetic waves, and include conduction current sources, magnetic induction sources, and displacement current sources. Conduction current sources, representing current flow in wires, cables, and borehole casings, are the most commonly-used sources in field electromagnetic data acquisition experiments.

An explicit, time-domain, finite-difference (FD) numerical method is used to solve the EH system for the three components of the electric vector E and the three components of the magnetic vector H, as functions of position and time. A three-dimensional gridded representation of the electromagnetic medium parameters, referred to as the "earth model" is required, and may be constructed from available geophysical logs and geological information. A magnitude, direction, and waveform for the current source are also input to the algorithm. The waveform may have a pulse-like shape (as in a Gaussian pulse), or may be a repeating square wave containing both positive and negative polarity portions, but is not limited to these two particular options. Execution of the numerical algorithm generates electromagnetic responses in the form of time series recorded at receiver locations distributed on or within the gridded earth model. These responses represent the three components of the E or H vector, or their time-derivatives.

Repeated execution of the finite-difference numerical algorithm enables a quantitative estimate of the magnitude and frequency-content of electromagnetic responses (measured on the earth's surface or in nearby boreholes) to be made as important modeling parameters are varied. For example, the depth of current source may be changed from shallow to deep. The current source may be localized at a point, or may be a spatially-extended transmission line, as with an electrically charged borehole casing. The source waveform may be broad-band or narrow-band in spectral content. Finally, changes to the electromagnetic earth model can be made, perhaps to assess the shielding effect of shallow conductive layers. The goal of such a modeling campaign is to assess the sensitivity of recorded electromagnetic data to variations in pertinent parameters. In turn, this information is used to design optimal field data acquisition geometries that have enhanced potential for imaging a proppant-filled fracture at depth.

The electric and magnetic responses are scalable with the input current magnitude. In order to obtain responses above the background electromagnetic noise, a large current on the order of 10 to 100 amps may be required. The impedance of the electric cable to the current contact point and the earth contact resistance will determine the voltage that is required to obtain a desired current. The contact resistance is expected to be small and will not dominate the required voltage. In addition, it may be necessary to sum many repetitions of the measured data to obtain a measurable signal level over the noise level. In the field application and modeling scenarios, a time-domain current source waveform may be used. A typical time-domain waveform consists of an on time of positive current followed by an off time followed by an on time of negative current. In other words, + current, then off, then – current, then off again. The repetition rate to be used would be determined by how long the current has to be on until a steady-state is reached or alternatively how long the energizing current has to be off until the fields have died to nearly zero. In this exemplary method, the measured responses would be analyzed using both the steady-state values and the decaying fields following the current shut-off. The advantage of analyzing the data when the energizing current is zero (decaying fields) is that the primary field contribution (response from the transmitting conductor; i.e., the well casing) has been eliminated and only the earth responses are measured. In addition, the of period of the time domain input signal allows analysis of the direct current electrical fields that may arise from electro-kinetic effects, including but not limited to, flowing fluids and proppant during the fracturing process. Fracture properties (orientation, length, volume, height and asymmetry will be determined through inversion of the measured data and/or a form of holographic reconstruction of that portion of the earth (fracture) that yielded the measured electrical responses or secondary fields. According to certain embodiments, a pre-fracture survey will be prepared to isolate the secondary fields due to the fracture. Those of ordinary skill in the art will recognize that other techniques for analyzing the recorded electromagnetic data, such as use of a pulse-like current source waveform and full waveform inversion of observed electromagnetic data may also be used.

A field data acquisition experiment was conducted to test the transmission line representation of a well casing current source. The calculated electric field and the measured electric field are in good agreement. This test demonstrates that the transmission line current source implementation in the 3D finite-difference electromagnetic code gives accurate results. The agreement, of course, depends upon an accurate model describing the electromagnetic properties of the earth. In this field data acquisition experiment, common electrical logs were used to characterize the electrical properties of the earth surrounding the test well bore and to construct the earth model.

The following examples are included to demonstrate illustrative embodiments of the present invention. It will be appreciated by those of ordinary skill in the art that the techniques disclosed in these examples are merely illustrative and are not limiting. Indeed, those of ordinary skill in the art should, in light of the present disclosure, appreciate that many changes can be made in the specific embodiments that are disclosed, and still obtain a like or similar result without departing from the spirit and scope of the invention.

Example 1

Conventional low density and medium density ceramic proppants which are commercially available from CARBO Ceramics, Inc. of Houston, Tex. under the trade names CARBOLite (CL) 20/40, HydroProp 40/80, CARBOProp 20/40 and CARBOProp 40/70 were coated with thin layers of metals using RE magnetron sputtering. Three metal targets were used for the depositions, namely aluminum, copper and nickel. The depositions were performed in a sputter chamber using a 200 W RE power, a deposition pressure of 5 in Torr, and an argon background (90 sccm). The sputter chamber had three articulating 2 inch target holders that can be used to coat complex shapes. The system also had a rotating water-cooled sample stage that was used in a sputter-down configuration. Prior to coating the proppants, deposition rates for the three metals were determined by sputtering the metals onto silicon wafers and measuring the coating thickness by scanning electron microscope (SEM) cross-sectional analysis with a Zeiss Neon 40 SEM.

The proppants were loaded into the sputter chamber in a 12 inch diameter aluminum pan with 1 inch tall sides. Approximately 130 g of proppant was used for each coating run. This amount of proppant provided roughly a single layer of proppant on the base of the pan. The proppant was "stirred" during the deposition using a 6 inch long fine wire metal that was suspended above the pan and placed into contact with the proppant in the pan. The coating deposition times were doubled compared to what was determined from the silicon wafer coating thickness measurements to account for roughly coating the proppants on one side, rolling them over, and then coating the other side. Coatings of approximately 100 nm and approximately 500 nm were deposited on each type of proppant with each of the three metals.

Following the coating process, the proppant was inspected visually and by optical microscopy. The results indicated that the proppant having a thinner coating of approximately 100 nm had a generally non-uniform coating while the proppant with the thicker coating of approximately 500 nm had a uniform coating.

Example 2

Conventional low density ceramic proppants which are commercially available from CARBO Ceramics, Inc. of Houston, Tex. under the trade names of CARBOLite 20/40 and HydroProp 40/80 were coated with thin layers of a conductive polymer using a planetary bench mixer with a "B" flat beater and a heating mantle. Approximately 500 g of proppant was used for each coating run. Coatings of 0.1% by weight and 0.4% by weight of the proppant were prepared as shown in Table I below:

TABLE I

| Conductive polymer | 0.1% coating | 0.4% coating |
|---|---|---|
| PEDOT:PSS Obtained from Sigma-Aldrich as a 1.2% solution in water | 42 g | 167 g |
| PANI Obtained from Sigma-Aldrich in an emeraldine base, as a 5% solution in tetrahydrofuran (THF) and doped with a 4-dodecylbenzene sulfonic acid in a 1:1 molar ratio | 10 g | 40 g |
| PPY Obtained from Sigma-Aldrich as a eloped 5% dispersion in water | 10 g | 40 g |

In each case, the proppant was heated to a temperature of 150-200° C. in an oven and was added to a steel mixing bowl. An adhesion promoter, such as aminopropyl triethoxy silane, an amino-functional coupling agent, and glycidyloxypropyl trimethoxy silane, a functional organosilane coupling agent, was added to the heated proppant to enhance the bond between the inorganic substrate and the organic polymer. The mixing bowl was set in an external heating mantle to allow the heat to remain in the system as additives were added. The "B" flat beater traveled along the side of the wall surfaces of the mixing bowl in circular orbits at an intermediate speed of approximately 280 rpm while the mixing bowl stayed in place, thereby allowing complete mixing in a short time. A typical batch schedule is shown in Table II below:

TABLE II

Coating Schedule on Ceramics:

| Ingredient | Time of Addition |
|---|---|
| Substrate | 0 s |
| Adhesion Promoter | 7 s |
| Conductive Polymer | 15 s |
| End Cycle | 5-10 min |

Additionally, 0.1% and 0.4% coatings were made by adding PEDOT:PSS to a phenol-formaldehyde (Novolac) coating using a planetary mixer with "B" flat beater and a heating mantle as described above. Approximately 500 g of proppant was used for each coating run. For a 0.1% and 0.4% by weight coating of the proppant, approximately 42 g and 167 g of PEDOT:PSS, respectively, were added to 500 g of proppant with 20 g of phenol-formaldehyde (Novolac) resin crosslinked with hexamine (13% hexamine based on phenol-formaldehyde (Novolac) resin) with and without adhesion promoters as mentioned above. A typical batch schedule is shown in Table III below:

TABLE III

Coating Schedule on Ceramics with Phenol-Formaldehyde Resin:

| Ingredient | Time of Addition |
|---|---|
| Substrate | 0 s |
| Phenol-Formaldehyde resin | 0 s |
| Adhesion Promoter | 7 s |
| Hexamine (cross-linker) | 30 s |
| Conductive Polymer | 1.5-2 min |
| End Cycle | 5-10 min |

Following the coating process, the coated proppant samples were inspected visually and by optical microscopy.

Example 3

Figure 8:
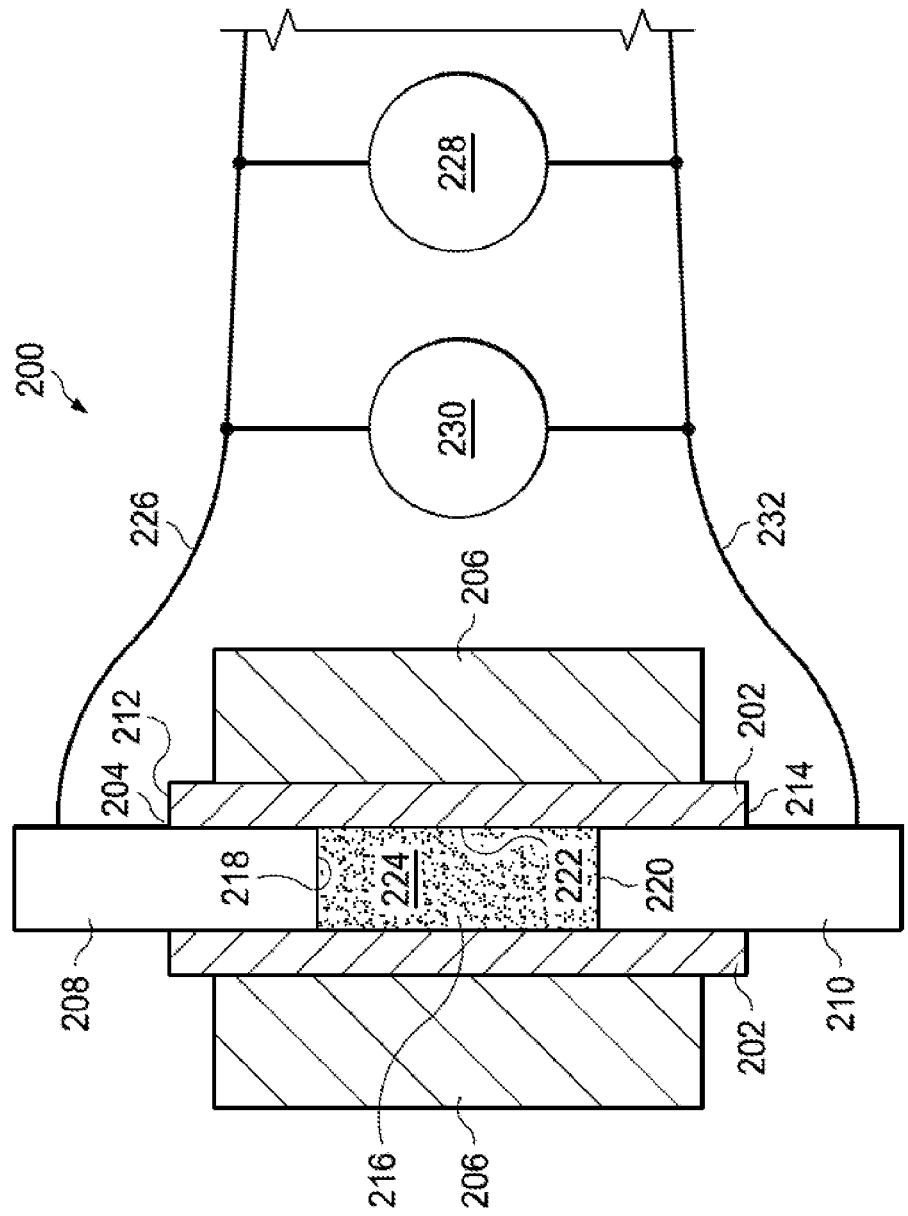
FIG. 8 is schematic illustration of a test system for measuring proppant electrical resistance.

The electrical conductivity of various proppant samples prepared according to Examples 1 and 2 as well as uncoated proppant samples were measured using the test device shown in FIG. 8. As shown in FIG. 8, the test system 200 included an insulating boron nitride die 202, having an inside diameter of 0.5 inches and an outside diameter of 1.0 inches, disposed in a bore 204 in a steel die 206 in which the bore 204 had an inside diameter of 1.0 inches. Upper and lower steel plungers 208 and 210 having an outside diameter of 0.5 inches were inserted in the upper and lower ends 212, 214, respectively, of the insulating boron nitride die 202 such that a chamber 216 is formed between the leading end 218 of the upper plunger 208, the leading end 220 of the lower plunger 210 and the inner wall 222 of the boron nitride sleeve 202. Upper plunger 208 was removed from the insulating boron nitride die 202 and proppant was loaded into the chamber 216 until the proppant bed 224 reached a height of about 1 to 2 cm above the leading end 220 of the lower plunger 210. The upper plunger 208 was then reinstalled in the insulating boron nitride die 202 until the leading end 218 of the upper plunger 208 engaged the proppant 224. A copper wire 226 was connected to the upper plunger 208 and one pole of each of a current source 228 and a voltmeter 230. A second copper wire 232 was connected to the lower plunger 210 and the other pole of each of the current source 228 and the voltmeter 230. The current source may be any suitable DC current source well known to those of ordinary skill in the art such as a Keithley 237 High Voltage Source Measurement Unit in the DC current source mode and the voltmeter may be any suitable voltmeter well known to those of ordinary skill in the art such as a Fluke 175 True RMS Multimeter which may be used in the DC mV mode for certain samples and in the ohmmeter mode for higher resistance samples.

The current source was powered on and the resistance of the test system 200 with the proppant bed 224 in the chamber 216 was then determined. The resistance of the proppant 224 was then measured with the Multimeter as a function of pressure using the upper plunger 108 and lower plunger 110 both as electrodes and to apply pressure to the proppant bed 224. Specifically, R=V/I—the resistance of the system with the plungers touching is subtracted from the values measured with the proppant bed 224 in the chamber 216 and the resistivity, $\rho = R*A/t$ where A is the area occupied by the proppant bed 224 and t is the thickness of the proppant bed 224 between the upper plunger 108 and the lower plunger 110.

The results were as follows:

Electrical measurements of base proppants without the addition of any conductive material were conducted at 100 V DC on samples that were 50 volume % proppant in wax that were pressed into discs nominally 1 inch in diameter and approximately 2 mm thick. Using these values to calculate the resistivity and using the measured resistivity for pure wax, the values below were extrapolated by plotting log(resistivity) vs. volume fraction proppant and extrapolating to a volume fraction of one:

CarboProp 40/70: $2 \times 10^{12}$ Ohm-cm

CarboProp 20/40: $0.6 \times 10^{12}$ Ohm-cm

CarboHydroProp: $1.8 \times 10^{12}$ Ohm-cm

CarboEconoProp: $4 \times 10^{12}$ Ohm-cm

It should be noted that the resistivities of the samples measured above are very high and not suitable for detection in the present invention.

Electrical measurements of base proppants with coatings of aluminum in thicknesses of 100 nm and 500 nm prepared according to Example 1, and base proppants with coatings of 0.1% or 0.4% of poly(3,4-ethylenedioxythiophene) (PEDOT), with or without amino silane were conducted. The results are shown in Table IV below and FIG. 9.

TABLE IV

| Description | Resistivity (ohm-cm) | | | | |
|---|---|---|---|---|---|
| | 0 psi | 1500 psi | 2500 psi | 3000 psi | 5000 psi |
| Base Material-no coating/no modification | $9 \times 10^{12}$ | Not measured | Not measured | Not measured | Not measured |
| CL w/0.1% PEDOT | Not measured | 1000 to 5000 | 1000 to 5000 | 1000 to 5000 | 1000 to 5000 |
| CL w/0.1% PEDOT/amino silane | Not measured | 10,000 to 100,000 | 10,000 to 50,000 | 10,000 to 25,000 | Not measured |
| CL w/0.4% PEDOT | Not measured | 1000 to 5000 | 1000 to 5000 | 1000 to 5000 | 1000 to 5000 |
| CL w/0.4% PEDOT/amino silane | Not measured | 5000 to 10,000 | ~5000 | ~5000 | Not measured |
| CL w/100 nm Al coat | Not measured | 1,000 | 1,000 | 1,000 | Not measured |
| CL w/500 nm Al coat | 5 to 10 | ~0 | 0.1-0 | 0.1-0 | 0.1-0 |
| CL w/500 nm Al coat | Not measured | ~0 | 0.27 | Not measured | Not measured |
| HP w/100 nm Al coat | Not measured | >1,000,000 | >1,000,000 | >1,000,000 | >1,000,000 |
| HP w/500 nm Al coat | Not measured | 0-1 | 0.30 | 0-1 | 0-1 |

Figure 9:
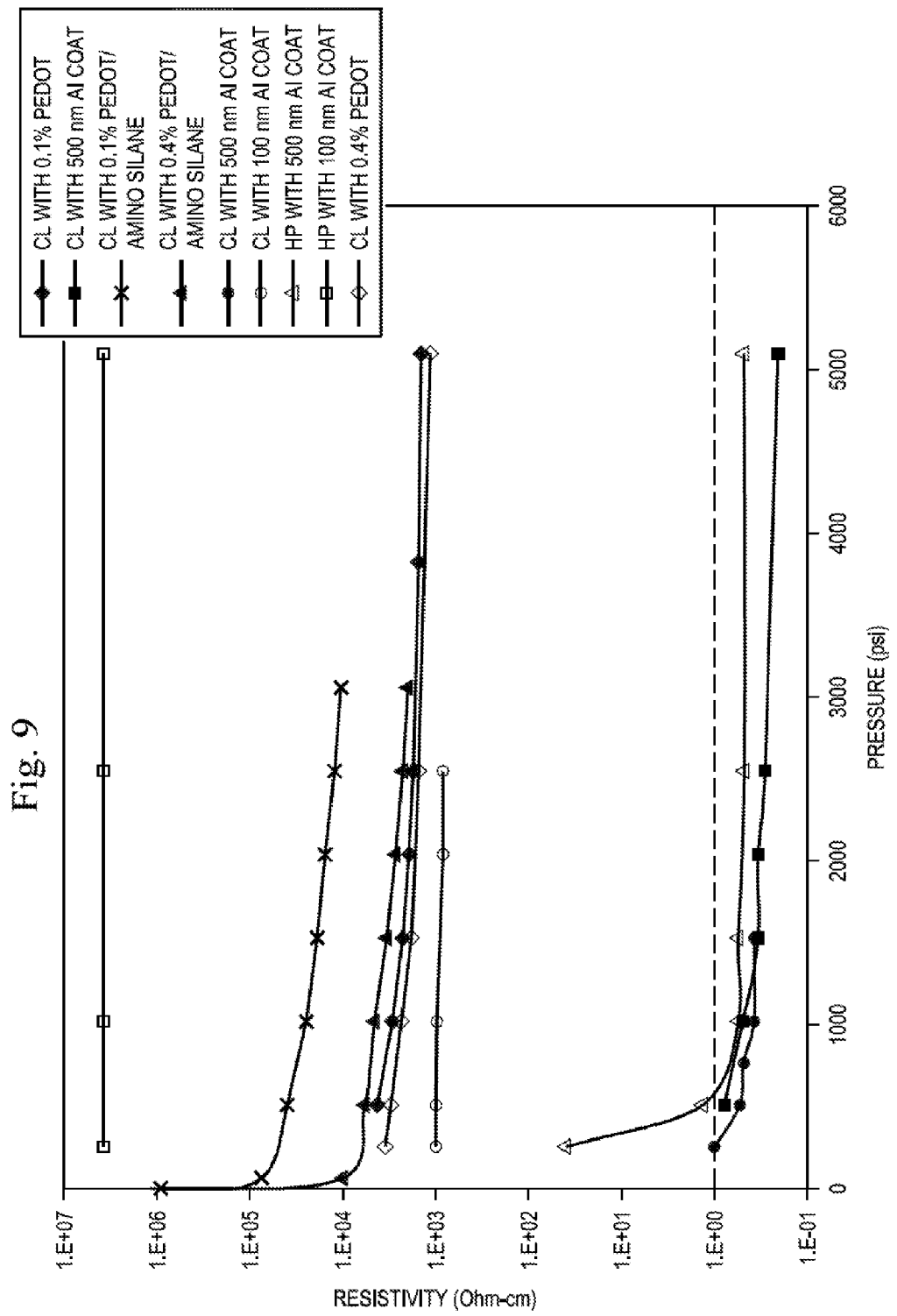
FIG. 9 is a graph of resistivity (Ohm-cm) vs. Closure Pressure (psi) for various proppant samples.

As can be seen from FIG. 9, the best results in terms of conductivity were obtained with CarboLite (CL) 20/40 and HydroProp (HP) 40/80 having a 500 nm thick coating of aluminum.

Electrical measurements of mixtures of base proppants with varying percentages of such base proppants with coatings of aluminum in thicknesses of 500 nm prepared according to Example 1 were conducted. The results are shown in Tables V and VI below and FIGS. 10-11.

Table V shows data for mixtures of CarboLite 20/40 with a 500 nm coating of aluminum and CarboLite 20/40 with no added conductive material. For each sample shown in Table V, 3 g. of the sample material was placed in the 0.5 inch die to provide an area of 0.196 square inches. The applied current for each test was 5 mA and the tests were conducted at room temperature.

TABLE V

| Load (lbs) | Pressure (psi) | Voltage (mV) | Resistance (Ohm) | Resistivity (Ohm-cm) |
|---|---|---|---|---|
| 80% 500 nm Al-coated CarboLite with 20% CarboLite 20/40 | | | | |
| 100 | 509 | 6.1 | 1.22 | 1.107 |
| 200 | 1019 | 5.6 | 1.12 | 1.016 |
| 300 | 1528 | 5.0 | 1.00 | 0.907 |
| 400 | 2037 | 4.7 | 0.94 | 0.853 |
| 500 | 2546 | 4.5 | 0.90 | 0.817 |
| 60% 500 nm Al-coated CarboLite with 40% CarboLite 20/40 | | | | |
| 200 | 1019 | 20.0 | 4.00 | 3.630 |
| 300 | 1528 | 17.8 | 3.56 | 3.230 |
| 400 | 2037 | 17.0 | 3.40 | 3.085 |
| 500 | 2546 | 16.1 | 3.22 | 2.922 |
| 600 | 3056 | 15.8 | 3.16 | 2.867 |
| 40% 500 nm Al-coated CarboLite with 60% CarboLite 20/40 | | | | |
| 100 | 509 | 253 | 50.60 | 46.516 |
| 200 | 1019 | 223 | 44.60 | 41.000 |
| 300 | 1528 | 218 | 43.60 | 40.080 |
| 400 | 2037 | 226 | 45.20 | 41.552 |
| 500 | 2546 | 221 | 44.20 | 40.632 |

Table VI shows data for mixtures of HydroProp 40/80 with a 500 nm coating of aluminum and HydroProp 40/80 with no added conductive material. For each sample shown in Table VI, 3 g. of the sample material was placed in the 0.5 inch die to provide an area of 0.196 square inches. The applied current for each test was 5 mA and the tests were conducted at room temperature.

TABLE VI

| Load (lbs) | Pressure (psi) | Voltage (mV) | Resistance (Ohm) | Resistivity (Ohm-cm) |
|---|---|---|---|---|
| 80% 500 nm Al-coated HydroProp 40/80 with 20% HydroProp 40/80 | | | | |
| 100 | 509 | 5.9 | 1.18 | 1.083 |
| 200 | 1019 | 5.3 | 1.06 | 0.973 |
| 300 | 1528 | 4.9 | 0.98 | 0.900 |
| 400 | 2037 | 4.6 | 0.92 | 0.845 |
| 500 | 2546 | 4.4 | 0.88 | 0.808 |
| 60% 500 nm Al-coated HydroProp 40/80 with 40% HydroProp 40/80 | | | | |
| 200 | 1019 | 17.5 | 3.50 | 3.167 |
| 300 | 1528 | 15.6 | 3.12 | 2.823 |
| 400 | 2037 | 14.5 | 2.90 | 2.624 |
| 500 | 2546 | 13.8 | 2.76 | 2.497 |
| 40% 500 nm Al-coated HydroProp 40/80 with 60% HydroProp 40/80 | | | | |
| 200 | 1019 | 550 | 110.00 | 99.532 |
| 300 | 1528 | 470 | 94.00 | 85.055 |
| 400 | 2037 | 406 | 81.20 | 73.473 |
| 500 | 2546 | 397 | 79.40 | 71.844 |

Figure 10:
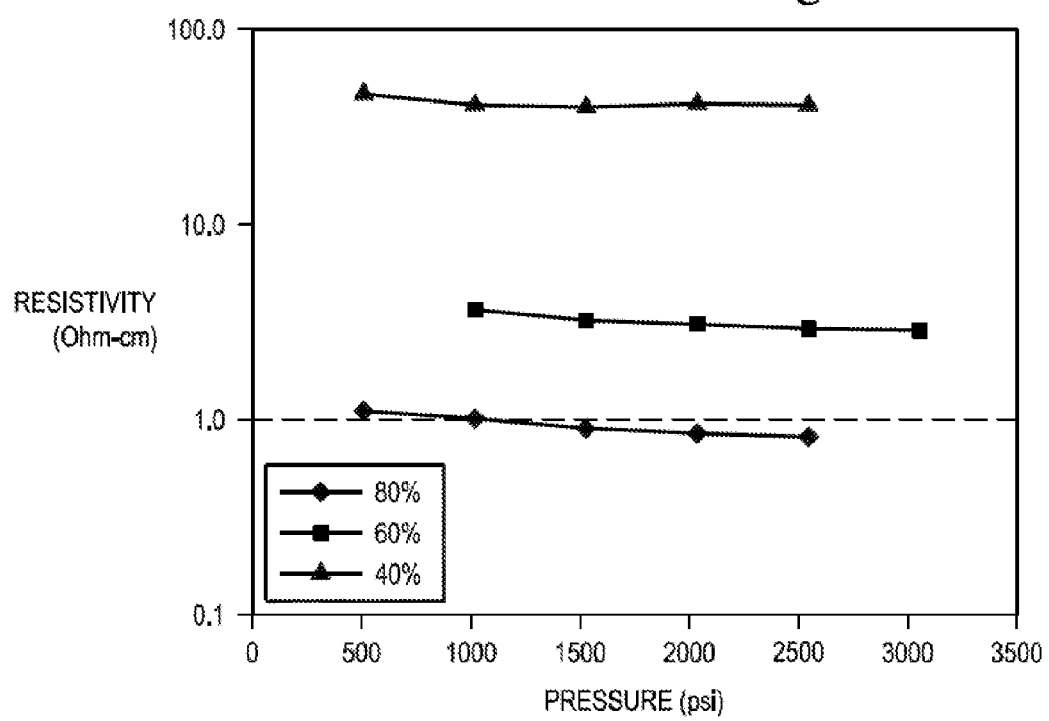
FIG. 10 is a graph of resistivity (Ohm-cm) vs. Closure Pressure (psi) for mixtures of CARBOLite 20/40 coated with aluminum and standard EconoProp 20/40 samples.
Figure 11:
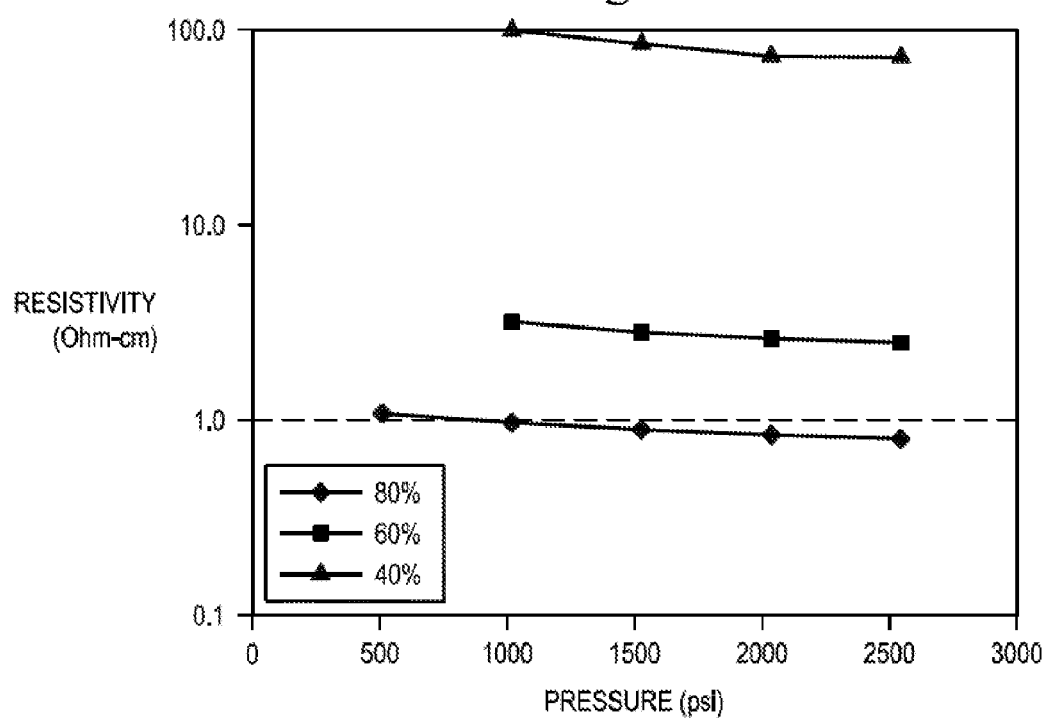
FIG. 11 is a graph of resistivity (Ohm-cm) vs. Closure Pressure (psi) for mixtures of Hydroprop 40/80 coated with aluminum and standard Hydroprop 40/80 samples.

As can be seen from TABLES V and VI as well as FIGS. 10-11, the resistivity of the proppant packs, regardless of the relative amounts of coated or un-coated proppant, tends to decrease with increasing closure pressure. In addition, as the relative amount of uncoated proppant increases and the relative amount of coated proppant decreases, the resistivity of the proppant packs increases dramatically. Lastly, the lowest resistivity is achieved with 100% Al-coated proppant. No mixture of coated and uncoated proppant results in a resistivity measurement less than 100% Al-coated proppant.

When used as a proppant, the particles described herein may be handled in the same manner as conventional proppants. For example, the particles may be delivered to the well site in bags or in bulk form along with the other materials used in fracturing treatment. Conventional equipment and techniques may be used to place the particles in the formation as a proppant. For example, the particles are mixed with a fracture fluid, which is then injected into a fracture in the formation.

In an exemplary method of fracturing a subterranean formation, a hydraulic fluid is injected into the formation at a rate and pressure sufficient to open a fracture therein, and a fluid containing sintered, substantially round and spherical particles prepared from a slurry as described herein and having one or more of the properties as described herein is injected into the fracture to prop the fracture in an open condition.

The foregoing description and embodiments are intended to illustrate the invention without limiting it thereby. It will be understood that various modifications can be made in the invention without departing from the spirit or scope thereof.

What is claimed is:

1. A proppant pack comprising:
a plurality of sintered, substantially round and spherical particles, each said particle, comprising a substantially uniform coating of an electrically conductive material having a thickness of at least 500 nm for uniform coating of said particle, wherein the substantially uniform coating is formed on an outer surface of each said particle, and wherein the sintered, substantially round and spherical particles have an apparent specific gravity of less than 3.8 g/cm$^3$.

2. The proppant pack of claim 1, wherein the electrically conductive material comprises a metal selected from the group consisting of aluminum, copper and nickel.

3. The proppant of claim 1, wherein the proppant pack has a resistivity of less than 0.5 ohm-cm due at least in part to the thickness of the substantially uniform coating.

4. The proppant pack of claim 1, wherein the electrically conductive material comprises a material selected from the group consisting of aluminum, copper, nickel, poly(3,4-ethylenedioxythiophene), poly(styrenesulfonate) (PEDOT:PSS), polyanilines (PANI), and polypyrroles (PPY).

5. The proppant pack of claim 1, wherein the electrically conductive material is copper.

6. The proppant pack of claim 1, wherein the electrically conductive material has been deposited on the outer surface using RF magnetron sputtering.

7. The proppant pack of claim 1, wherein the thickness of the substantially uniform coating is approximately 500 nm.

8. The proppant pack of claim 1, wherein each said particle has a size between 20 U.S. Mesh and 40 U.S. Mesh.

9. A method of fracturing a subterranean formation and detecting, locating and characterizing a proppant used in the fracturing, comprising:
injecting a hydraulic fluid into a wellbore extending into the subterranean formation at a rate and pressure sufficient to open a fracture therein;
injecting into the fracture a fluid containing electrically conductive sintered, substantially round and spherical particles;
electrically energizing the earth at or near the fracture; and
measuring three dimensional (x, y, and z) components of electric and magnetic field responses at a surface of the earth or in an adjacent wellbore.

10. The method of claim 9, wherein the method further comprises:
electrically energizing the earth at or near the fracture prior to the opening of the fracture; and
comparing the three dimensional components of the electric and magnetic field responses prior to the opening of the fracture to the electric and magnetic field responses after the opening of the fracture and the injection into the fracture of the fluid containing the electrically conductive sintered, substantially round and spherical particles to determine proppant location.

11. The method of claim 9, wherein the measured three dimensional components of the electric and magnetic field responses are analyzed with imaging methods selected from the group consisting of an inversion algorithm based on Maxwell's equations of electromagnetism and electromagnetic holography to determine a proppant pack location, wherein, in the inversion algorithm, parameters of an earth model are adjusted to obtain a fit to a plurality of forward model calculations of responses for an assumed earth model, and wherein, in the electromagnetic holography, the electric and magnetic field responses and a source wave form are projected into an earth volume to form an image of the proppant pack location using constructive and destructive interferences.

12. The method of claim 9, wherein electromagnetic wave forms selected from the group consisting of Gaussian, square and time domain are used as an input signal to generate the three dimensional electric field and magnetic field responses.

13. The method of claim 12, wherein, numerical simulations, solving Maxwell's equations of electromagnetism for the electric and magnetic fields are performed, prior to field applications, to determine temporal characteristics of an optimum input wave form and a recording sensor array geometry to be used in the field applications, wherein the numerical simulations are based upon an earth model determined from geophysical logs and geological information.

14. A method, comprising:
electrically energizing a casing of a wellbore that extends from a surface of the earth into a subterranean formation having a fracture that is at least partially filled with an electrically conducting proppant;
measuring three dimensional (x, y, and z) components of electric and magnetic field responses at the surface or in an adjacent wellbore; and
determining a location of the electrically conducting proppant through comparison of the responses to numerical simulations and/or inversion of the responses to determine a source of the responses.

15. The method of claim 14, further comprising injecting into the fracture the electrically conducting proppant and wherein the electrically conducting proppant includes electrically conductive sintered, substantially round and spherical particles.

16. The method of claim 15, further comprising, prior to the injecting of the electrically conducting proppant into the fracture, injecting a hydraulic fluid into the wellbore at a rate and pressure sufficient to open the fracture therein.

17. The method of claim 14, further comprising localizing a current in the casing by providing electrically insulating pipe joints or pipe collars for the casing.

18. The method of claim 14, wherein the measuring of the three dimensional (x, y, and z) components of electric and magnetic field responses at the surface or in an adjacent wellbore comprises measuring the three dimensional (x, y, and z) components of electric and magnetic field responses using an array of sensors distributed at or near the surface and at least partially over the fracture.

19. The method of claim 18, further comprising performing a modeling operation to determine a maximum dimension for the sensor array.

20. The method of claim 14, wherein, numerical simulations, solving Maxwell's equations of electromagnetism for the electric and magnetic fields are performed, prior to field applications, to determine temporal characteristics of an optimum input wave form and a recording sensor array geometry to be used in the field applications, wherein the numerical simulations are based upon an earth model determined from geophysical logs and geological information.

* * * * *